US012751137B2

(12) United States Patent
Jeong et al.

(10) Patent No.: US 12,751,137 B2
(45) Date of Patent: Sep. 29, 2026

(54) DISPLAY DEVICE AND METHOD OF PROVIDING THEREOF

(71) Applicant: Samsung Display Co., LTD., Yongin-si (KR)

(72) Inventors: Yu-Gwang Jeong, Anyang-si (KR); Jin-Su Byun, Seoul (KR); Sung Won Cho, Hwaseong-si (KR); Su Bin Bae, Hwaseong-si (KR); Dawoon Jung, Hwaseong-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 703 days.

(21) Appl. No.: 17/881,693

(22) Filed: Aug. 5, 2022

(65) Prior Publication Data

US 2023/0200113 A1 Jun. 22, 2023

(30) Foreign Application Priority Data

Dec. 20, 2021 (KR) ........................ 10-2021-0182834

(51) Int. Cl.

*H10K 50/844* (2023.01)
*H10K 59/131* (2023.01)
*H10K 59/40* (2023.01)
*H10K 71/00* (2023.01)
*H10K 59/12* (2023.01)

(52) U.S. Cl.

CPC ......... *H10K 50/844* (2023.02); *H10K 59/131* (2023.02); *H10K 59/40* (2023.02); *H10K 71/00* (2023.02); *H10K 59/1201* (2023.02)

(58) Field of Classification Search

CPC ............. H10K 50/844; H10K 59/1201; H10K 59/131; H10K 59/40; H10K 71/00

See application file for complete search history.

(56) References Cited

U.S. PATENT DOCUMENTS

2018/0061895 A1* 3/2018 Kim ..................... H10K 59/122
2019/0088904 A1* 3/2019 Cho ..................... H10K 50/844
2019/0363154 A1* 11/2019 Kaneko .................. H05B 33/02

(Continued)

FOREIGN PATENT DOCUMENTS

CN 112151445 A 12/2020
KR 1020190048784 A 5/2019

(Continued)

OTHER PUBLICATIONS

Schaer et al., "Water Vapor and Oxygen Degradation Mechanisms in Organic Light Emitting Diodes", Advanced Functional Materials, 11, No. 2, Apr. 2001, p. 116.

*Primary Examiner* — Jeff W Natalini
*Assistant Examiner* — Ian Isaac Degrasse
(74) *Attorney, Agent, or Firm* — CANTOR COLBURN LLP

(57) ABSTRACT

A display device includes a display area, anon-display area, and a pad part in the non-display area and exposed to outside the display device. The pad part includes a conductive part, and an insulating part defining an opening exposing the conductive part to outside the pad part. The insulating part includes in order from the conductive part a first insulating layer defining a first opening, and a second insulating layer facing the first insulating layer and defining a second opening which is wider than the first opening.

7 Claims, 32 Drawing Sheets

(56) References Cited

U.S. PATENT DOCUMENTS

| | | | | |
|---|---|---|---|---|
| 2020/0058727 | A1* | 2/2020 | Kim | H10K 59/8051 |
| 2020/0227507 | A1* | 7/2020 | Managaki | G06F 1/1652 |
| 2020/0335570 | A1* | 10/2020 | Long | H10K 50/844 |
| 2020/0381504 | A1* | 12/2020 | An | G09G 3/3275 |
| 2021/0036075 | A1* | 2/2021 | Wang | H10K 59/124 |

FOREIGN PATENT DOCUMENTS

| | | | |
|---|---|---|---|
| KR | 1020190048785 | A | 5/2019 |
| KR | 10-2032748 | B1 | 10/2019 |
| KR | 10-2094143 | B1 | 3/2020 |
| KR | 10-2165742 | B1 | 10/2020 |

* cited by examiner

DISPLAY DEVICE AND METHOD OF PROVIDING THEREOF

This application claims priority to Korean Patent Application No. 10-2021-0182834 filed on Dec. 20, 2021, and all the benefits accruing therefrom under 35 U.S.C. § 119, the entire contents of which are incorporated herein by reference.

BACKGROUND

1. Field

The present disclosure relates to a light emitting display device and a method of manufacturing (or providing) thereof. More particularly, the present disclosure relates to a light emitting display device and method thereof that may include a pad in a non-display area.

2. Description of the Related Art

A display device is a device for displaying an image, and includes a liquid crystal display (LCD), an organic light emitting diode (OLED) display, and the like. The display device is used in various electronic devices such as a mobile phone, a navigation device, a digital camera, an electronic book, a portable game machine, and various terminals.

A display device such as an organic light emitting display device may have a structure that is bendable or foldable such as to be bent or folded, by using a flexible substrate.

The display device is divided into a display area and a non-display area around the display area, and a pad part for applying a signal to the display area is formed in the non-display area.

SUMMARY

In an electronic device such as a mobile phone, an optical element such as a camera sensor and an optical sensor is provided in a bezel (non-display) area which is around a display area. However, as a size of the display area is increased while a size of a non-display area of the display area is gradually decreased, a technology in which a camera or an optical sensor may be on a rear surface of the display area is being developed. Where the display device is divided into a display area and a non-display area which is adjacent to the display area, a pad part for applying a signal to the display area is provided in the non-display area.

Embodiments are to provide a light emitting display device and a method of manufacturing (or providing) thereof that may include a pad part having a new structure.

An embodiment provides a light emitting display device, including a display area, a non-display area, and a pad part in the non-display area, where the pad part includes a conductive part, and an insulating part having an opening exposing the conductive part, and the insulating part includes a first insulating part having a first opening, and a second insulating part having a second opening wider than the first opening.

The second opening may overlap the first opening in a plan view, and may expose an upper surface of the first insulating part.

The display area may include a pixel including a light emitting element, an encapsulation layer covering the light emitting element, and a touch sensing part on the encapsulation layer, and the encapsulation layer may include a first inorganic encapsulation layer, an organic encapsulation layer, and a second inorganic encapsulation layer.

The first insulating part may include the first inorganic encapsulation layer, and the second insulating part may include the second inorganic encapsulation layer.

The touch sensing part may include a lower sensing insulating layer on the second inorganic encapsulation layer, a lower sensing electrode on the lower sensing insulating layer, an intermediate sensing insulating layer on the lower sensing electrode, an upper sensing electrode on the intermediate sensing insulating layer, and an upper sensing insulating layer on the upper sensing electrode.

The first insulating part may include the first inorganic encapsulation layer, and the second insulating part may include at least one of the second inorganic encapsulation layer, the lower sensing insulating layer, and the intermediate sensing insulating layer.

The first insulating part may include the second inorganic encapsulation layer, and the second insulating part may include at least one of the lower sensing insulating layer and the intermediate sensing insulating layer.

The pad part may be a pad part for a printed circuit board to be electrically connected to a printed circuit board or a pad part for a driver to be electrically connected to a data driver.

The pad part may further include the pad part for the touch sensing part, and the pad part for the touch sensing part may include a conductive part and an insulating part having an opening exposing the conductive part, and the insulating part may include the upper sensing insulating layer.

The conductive part of the pad part for the touch sensing part may include a first conductive part on the same layer as the lower sensing electrode, and a second conductive part on the same layer as the upper sensing electrode, and the first conductive part and the second conductive part may be connected to each other through an opening in the intermediate sensing insulating layer.

At least one of the first conductive part and the second conductive part may be formed as a triple layer.

A lower layer of the triple layer may include titanium (Ti), an intermediate layer thereof may include aluminum (Al), and an upper layer thereof may include titanium (Ti).

The second conductive part may be configured as a triple layer, and an upper layer of the second conductive part may be partially etched.

An embodiment provides a method of manufacturing (or providing) a light emitting display device, including forming, among a display area and a non-display area, a first insulating part and a second insulating part covering a conductive part of a pad part in the non-display area, forming a second opening exposing the first insulating part in the second insulating part, forming an additional insulating layer covering the second insulating part and the exposed first insulating part, forming a first opening smaller than the second opening in the additional insulating layer and the first insulating part, and removing the additional insulating layer.

The display area may include a pixel including a light emitting element, an encapsulation layer covering the light emitting element, and a touch sensing part on the encapsulation layer, the encapsulation layer may include a first inorganic encapsulation layer, an organic encapsulation layer, and a second inorganic encapsulation layer, and the first insulating part may include the first inorganic encapsulation layer.

The forming of the second opening in the second insulating part may be performed together when the second inorganic encapsulation layer is etched.

The touch sensing part may include a lower sensing insulating layer on the second inorganic encapsulation layer, a lower sensing electrode on the lower sensing insulating layer, an intermediate sensing insulating layer on the lower sensing electrode, an upper sensing electrode on the intermediate sensing insulating layer, and an upper sensing insulating layer on the upper sensing electrode, and the forming of the second opening in the second insulating part may be performed together when the lower sensing insulating layer or the intermediate sensing insulating layer is etched.

The forming of the additional insulating layer may be performed together with forming of the upper sensing insulating layer.

The pad part in the non-display area may further include the pad part for the touch sensing part, and the pad part for the touch sensing part may include forming a first conductive part together with the lower sensing electrode, forming the intermediate sensing insulating layer having an opening exposing the first conductive part, and forming a second conductive part together with the upper sensing electrode, and the first conductive part and the second conductive part may be connected to each other through an opening in the intermediate sensing insulating layer.

At least one of the first conductive part and the second conductive part may be formed as a triple layer.

According to the embodiments, when forming a touch sensing unit at an upper portion of an encapsulation layer, without forming an inorganic encapsulation layer included in the encapsulation layer with an open mask, a portion of the inorganic encapsulation layer at a pad part is fully removed to form the pad part, so that a delamination phenomenon or crack that may occur due to the open mask may be eliminated.

BRIEF DESCRIPTION OF THE DRAWINGS

The above and other advantages and features of this disclosure will become more apparent by describing in further detail embodiments thereof with reference to the accompanying drawings, in which.

DETAILED DESCRIPTION

Figure 1:
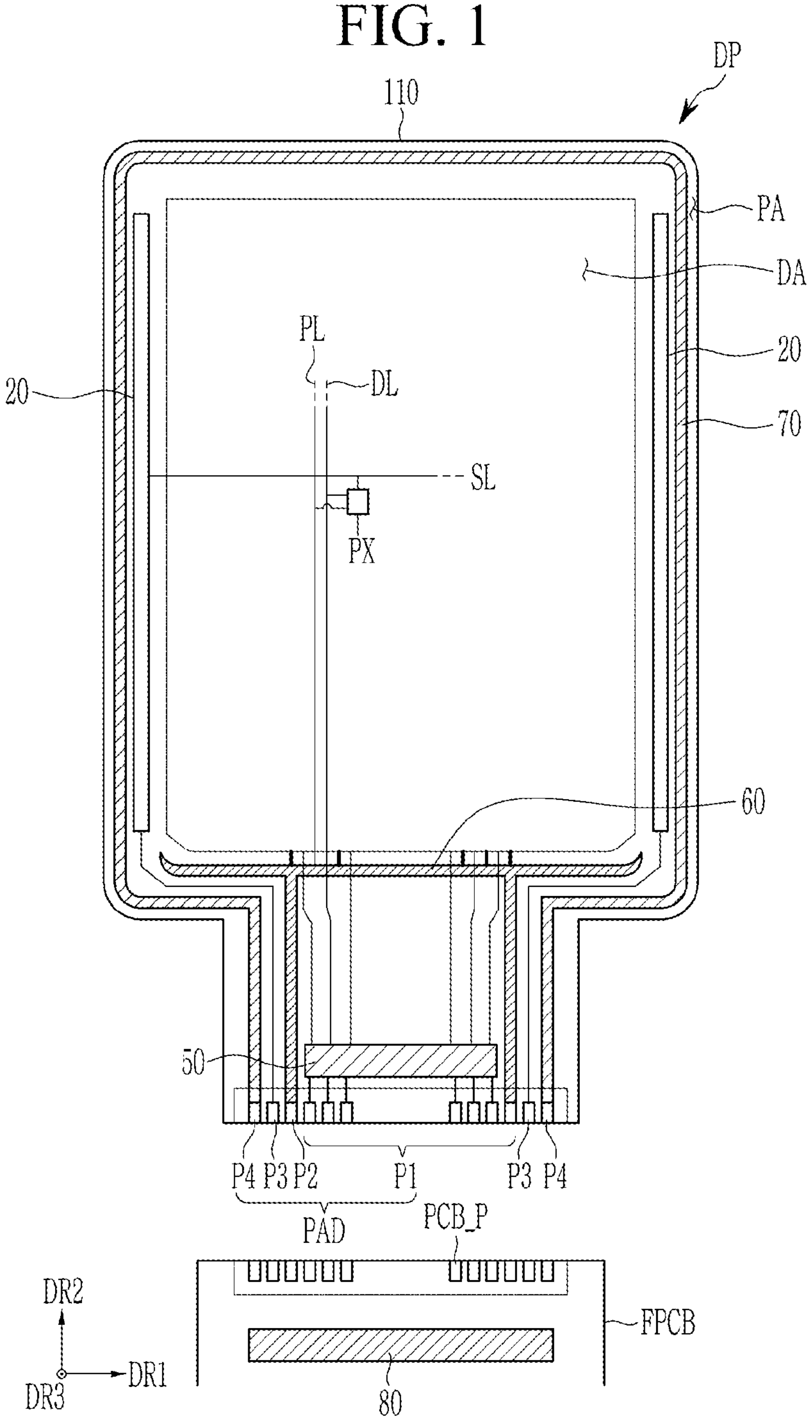
FIG. 1 illustrates a top plan view of a display panel according to an embodiment.

The invention will be described more fully hereinafter with reference to the accompanying drawings, in which embodiments of the invention are shown. As those skilled in the art would realize, the described embodiments may be modified in various different ways, all without departing from the spirit or scope of the invention.

In order to clearly describe the invention, parts or portions that are irrelevant to the description are omitted, and identical or similar constituent elements throughout the specification are denoted by the same reference numerals. As used herein, a reference number may indicate a singular element or a plurality of the element. For example, a reference number labeling a singular form of an element within the drawing figures may be used to reference a plurality of the singular element within the text of specification.

Further, in the drawings, the size and thickness of each element are arbitrarily illustrated for ease of description, and the present disclosure is not necessarily limited to those illustrated in the drawings. In the drawings, the thicknesses of layers, layers, panels, regions, areas, etc., are exaggerated for clarity. In the drawings, for ease of description, the thicknesses of some layers and areas are exaggerated.

It will be understood that when an element such as a layer, layer, region, area, substrate, plate, or constituent element is referred to as being related to another element such as being "on" another element, it can be directly on the other element or intervening elements may also be present. In contrast, when an element is referred to as being related to another element such as being "directly on" another element, there are no intervening elements present.

Further, in the specification, the word "on" or "above" means positioned on or below the object portion, and does not necessarily mean positioned on the upper side of the object portion based on a gravitational direction. Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

In addition, throughout the specification, "connected" does not mean only when two or more elements are directly connected, but when two or more elements are indirectly connected through other elements, and when they are physically connected or electrically connected, and further, it may be referred to by different names depending on a position or function, and may also be referred to as a case in which respective parts that are substantially integrated are linked to each other.

In addition, throughout the specification, when it is said that an element such as a wire, layer, layer, region, area, substrate, plate, or constituent element "is extended (or extends) in a first direction or second direction", this does not mean only a straight shape extending straight in the corresponding direction, but may mean a structure that substantially extends in the first direction or the second direction, is partially bent, has a zigzag structure, or extends while having a curved structure.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In addition, both an electronic device (for example, a mobile phone, a TV, a monitor, a laptop computer, etc.) including a display device, or a display panel DP described in the specification, and an electronic device including a display device and a display panel DP which are manufactured (or provided) by a method described in the specification are not excluded from the scope of the present specification.

Hereinafter, a structure of a display panel DP included in a display device will be described, and first, the structure of the display panel DP will be described in detail with reference to FIG. 1.

FIG. 1 illustrates a top plan view of some constituent elements of a display panel DP according to an embodiment.

Referring to FIG. 1, the display panel DP may be divided into a display area DA and a non-display area PA, and the non-display area PA may be defined along an edge of the display area DA. According to the embodiment, a light transmitting area may be included in the display area DA, and a camera or a photosensor may be disposed on a rear surface of the light transmitting area to photograph or sense an object at the front of the display panel DP which is opposite to the rear surface.

The display panel DP includes a plurality of pixels PX. The plurality of pixels PX may be disposed in the display area DA. Each of the pixels PX includes a light emitting element as a display element, which generates and/or emits light, displays an image, etc., and a pixel circuit which is connected to the light emitting element. Each pixel PX emits, for example, red, green, blue, or white light, and may include an organic light emitting element (organic light emitting diode) as an example.

The display panel DP may include a plurality of signal lines and a pad part. The plurality of signal lines may include a scan line SL extending in a first direction DR1, and a data line DL and a driving voltage line PL each extending in a second direction DR2 crossing the first direction DR1.

A scan driver 20 is positioned at the left and right of the display area DA, and generates and transmits a scan signal to each pixel PX through the scan line SL. The pixel PX may receive scan signals together from two scan drivers 20 positioned at the left and right sides.

A pad part PAD (hereinafter also referred to as a pad part for a circuit board) is disposed at one end of the non-display area PA of the display panel DP, and may include a plurality of terminals P1, P2, P3, and P4. The pad part PAD may be exposed to the outside (e.g., outside the display panel DP) without being covered by an insulation layer to be electrically connected to an external member such as a flexible printed circuit board FPCB. That is, the display device may include the pad part PAD in the non-display area, exposed to outside the display device and at which the display device is connected to an external member such as the flexible printed circuit board FPCB, a driver 50, etc.

The pad part PAD may be electrically connected to a pad part FPCB_P of the flexible printed circuit board FPCB. The flexible printed circuit board FPCB may transmit a signal or power source of an integrated circuit (IC) driving chip 80, to the pad part PAD. Meanwhile, in some embodiments, the pad part PAD may further include a pad part for a driver (see FIG. 4) for being electrically connected to a data driver 50 (otherwise referred to as a driver 50). In some embodiments, the pad part PAD may further include a pad part for a touch sensing part (see FIG. 24) connected to a sensing electrode of a touch sensing part included in the display panel DP.

The IC driving chip 80 converts a plurality of image signals transmitted from the outside, into a plurality of image data signals, and transmits the converted signals to the data driver 50 through the terminal P1. In addition, the IC driving chip 80 may receive a vertical synchronization signal, a horizontal synchronization signal, and a clock signal, and generate a control signal for controlling operations of the scan driver 20 and the data driver 50 to transmit the signal to each of the scan driver 20 and the data driver 50 through the terminals P3 and P1. The IC driving chip 80 transmits a driving voltage (ELVDD) to a driving voltage supply wire 60 through the terminal P2. In addition, the IC driving chip 80 may transmit a common voltage (ELVSS) to each common voltage supply wire 70 through the terminal P4.

The data driver 50 is disposed on the non-display area PA, and generates a data voltage (DATA) signal to be applied to each pixel PX to transmit the signal to each data line DL. The data driver 50 may be disposed at one side of the display panel DP, and for example, may be disposed between the pad part PAD and the display area DA. Referring to FIG. 1, the data line DL may extend along the second direction DR2, and may have a straight line structure.

The driving voltage supply wire 60 is disposed on the non-display area PA. For example, the driving voltage supply wire 60 may be disposed between the data driver 50 and the display area DA. The driving voltage supply wire 60 provides a driving voltage (ELVDD) to the pixels PX. The driving voltage supply wire 60 may be disposed in the first direction DR1, and may be connected to a plurality of driving voltage lines PL disposed in the second direction DR2.

The common voltage supply wire 70 is disposed on the non-display area PA. The common voltage supply wire 70 may have a shape surrounding a substrate SUB. The common voltage supply wire 70 transmits a common voltage (ELVSS) to one electrode (for example, a cathode) of the light emitting element included in the pixel PX.

The pixel PX may include a plurality of transistors, a capacitor, and a light emitting element, and the plurality of transistors may include one driving transistor and at least one switching transistor. The driving transistor may generate a driving current transmitted to the light emitting element, and in some embodiments, the pixel PX having various circuit structures may be used.

Hereinafter, a structure of the non-display area PA of the display panel DP will be described in more detail with reference to FIG. 2.

Figure 2:
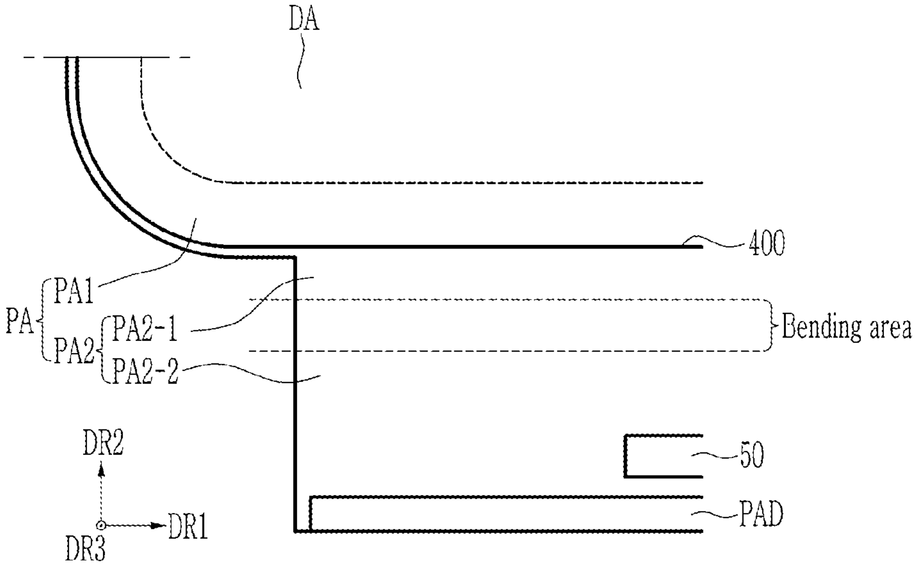
FIG. 2 is an enlarged top plan view illustrating a non-display area of a display panel according to an embodiment.

FIG. 2 is an enlarged top plan view illustrating in more detail a non-display area PA of a display panel DP according to an embodiment.

The non-display area PA may mainly include a first non-display area PA1 relative to which the display area DA is positioned at an inner side thereof, a driver 50, a pad part PDA, and a second non-display area PA2 including a connecting wire and a bending area.

The first non-display area PA1 is positioned to surround the outside of the display area DA, and indicates (e.g., extends) from a position at which the display area DA ends to a position at which an encapsulation layer 400 extending from the display area DA ends. That is, the encapsulation layer 400 may be formed in the display area DA, extend to the non-display area PA, and extend between a bending area and the display area DA of the non-display area PA. Here, the non-display area PA in which the encapsulation layer 400 is formed is referred to as a first non-display area PA1.

A second non-display area PA2 includes a (2-1)-th non-display area PA2-1 and a (2-2)-th non-display area PA2-2 positioned at both sides (e.g., opposing sides) of the bending area as a center.

The (2-1)-th non-display area PA2-1 indicates from the position at which the encapsulation layer 400 ends to the bending area, and the (2-2)-th non-display area PA2-2 may include from the end of the bending area to the end of the pad part PAD through the driver 50 (e.g., including a planar area of the driver 50). The driver 50 may further include a driver pad part for a driver to be electrically connected to the driver 50 mounted in a form of a chip. The pad part PAD positioned at the end of the (2-2)-th non-display area PA2-2 is also referred to as a pad part for a circuit board, and is a part electrically connected to the pad of the flexible printed circuit board FPCB.

In the display panel DP having the above-described planar structure, the light emitting display device is formed in a state in which the bending area is actually folded back (e.g., a folded state), and the folded state will be described with reference to FIG. 3.

Figure 3:
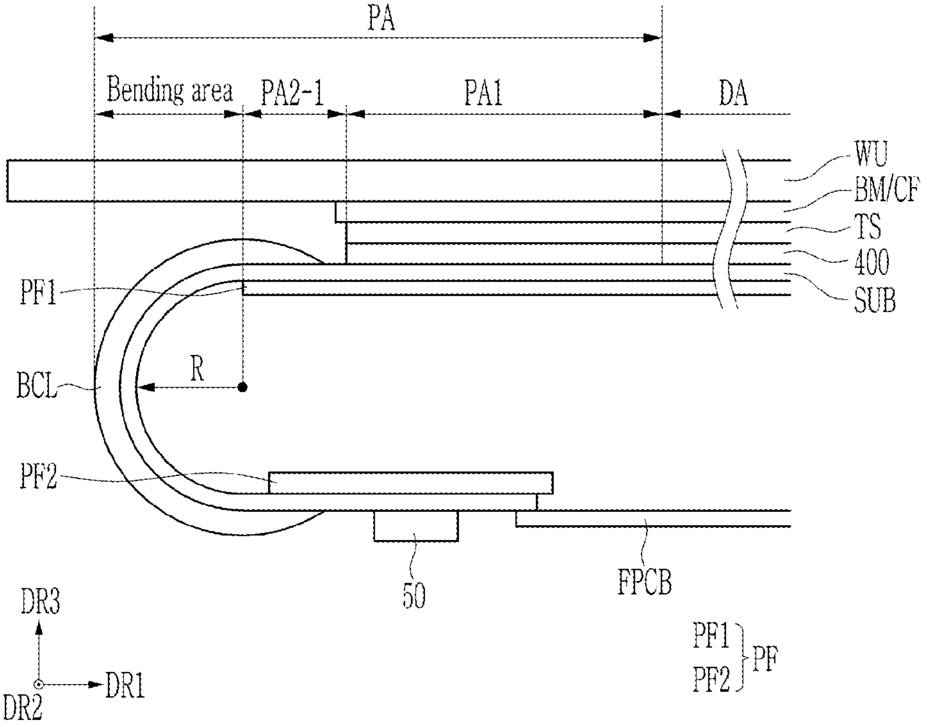
FIG. 3 illustrates an enlarged cross-sectional view of a portion of a display device according to an embodiment.

FIG. 3 illustrates an enlarged cross-sectional view of a portion of a light emitting display device according to an embodiment.

FIG. 3 schematically illustrates a substrate SUB, an encapsulation layer 400, a touch sensing part TS, a light blocking member BM, and a color filter CF layer by dividing the display panel DP.

A cover window WU is positioned on a front surface of the display panel DP, that is, on the light blocking member BM and the color filter CF layer in a third direction DR3, and the cover window WU extends to the bending area in which the substrate SUB is back folded and the non-display area PA.

The bending area of the display panel DP may further include a bending cover layer BCL, and the bending cover layer BCL may be made of (or include) an organic material.

A radius R value of the bending area may have a value of about 0.25 millimeters (mm) or more and about 0.45 mm or less.

The (2-2)-th non-display area PA2-2 of the non-display area PA, which is from the end of the bending area to the end of the pad part PAD through the driver 50, is positioned on the rear surface of the display panel DP, and thus may be hidden from a position at the front surface thereof. In addition, the driver 50 positioned in the (2-2)-th non-display area PA2-2 and the flexible printed circuit board FPCB extending from the (2-2)-th non-display area PA2-2 may also be positioned on the rear surface to be hidden from the front surface.

A protective layer PF for protecting the rear surfaces of the substrate SUB and the display panel DP is attached to the rear surface of the substrate SUB, and the protective layer PF may not be formed on the rear surface of the bending area so that the bending area may be easily folded. Referring to the embodiment of FIG. 3, the protective layer PF includes a first protective layer PF1 corresponding to the display area DA and a portion of the non-display area PA (the first non-display area PA1 and the (2-1)-the non-display area PA2-1), and a second protective layer PF2 corresponding to the (2-2)-th non-display area PA2-2.

In FIG. 3, two protective layers PF1 and PF2 adjacent to each other in the third direction DR3 are shown as being far apart from each other, but in reality, they may be in a state of being close to each other. That is, the protective layer PF is disconnected at the bending area.

Referring to FIG. 3, the light emitting display device may be configured by being accommodated in a housing in a state in which the light emitting display device is folded back.

Hereinafter, a cross-sectional structure of a display panel DP according to an embodiment will be described with reference to FIG. 4.

Figure 4:
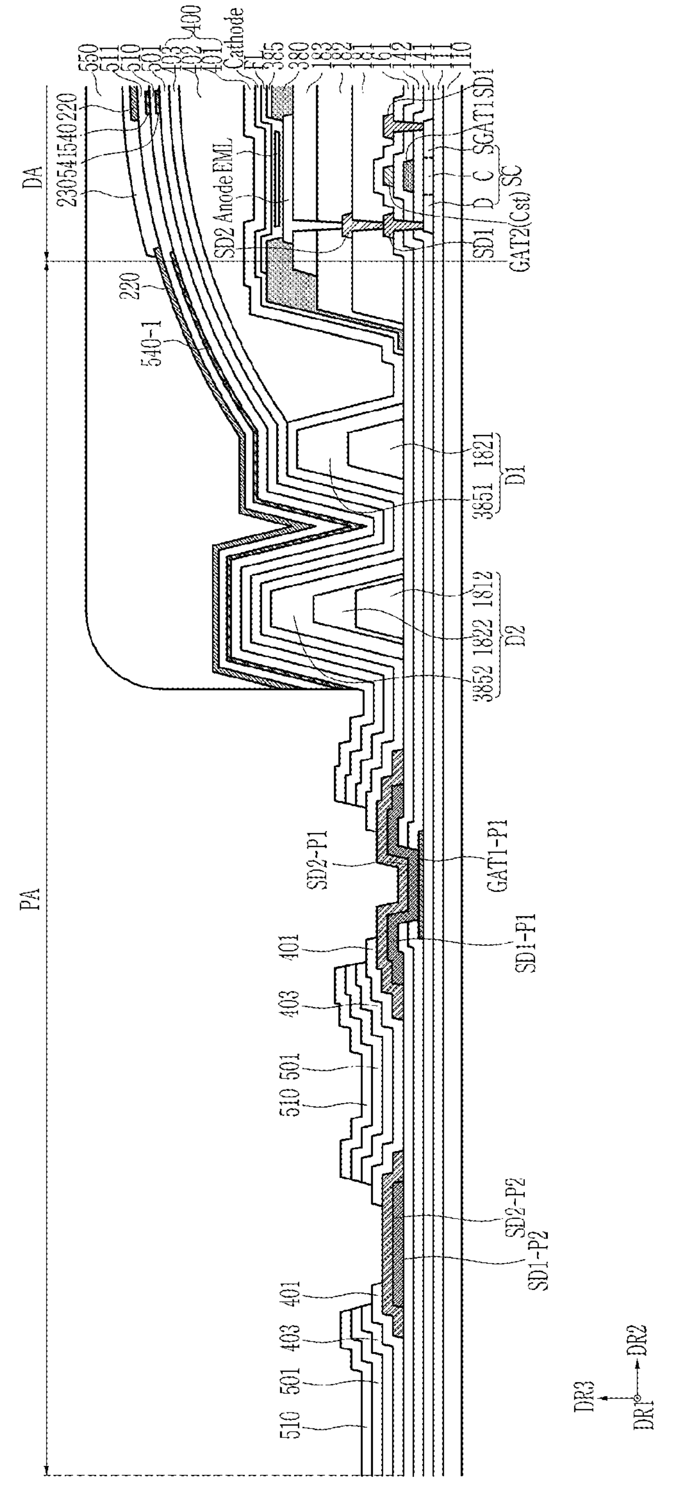
FIG. 4 illustrates a cross-sectional view of a non-display area of a display panel according to an embodiment.

FIG. 4 illustrates a cross-sectional view of a layered structure of a non-display area of a display panel DP according to an embodiment.

FIG. 4 illustrates the display area DA and the non-display area PA, and illustrates a pad area of the non-display area PA. Here, in the pad area, a pad part for a driver (IC Pad) and a pad part for a circuit board (FPCB Pad) are shown. The pad part for the driver (IC Pad) is a pad part for mounting the driver 50 in a form of a chip, and the pad part for the circuit board (FPCB Pad) is a pad part electrically connected to the pad of the flexible printed circuit board (FPCB). Here, the pad part for the driver (IC Pad) may be electrically connected to a conductive layer (fan-out wire) positioned in the bending area, and may also be electrically connected to the driver 50.

First, a layered structure of the display area DA of the display panel of FIG. 4 will be described.

In the display area DA, a buffer layer 111 is positioned on a substrate 110, and a semiconductor layer SC is positioned on the buffer layer 111. The semiconductor layer SC includes a channel C of a transistor, and a source region S thereof and a drain region D thereof are positioned at respective sides of the channel C. The semiconductor layer SC is covered with a first gate insulating layer 141, and a first gate conductive layer including a gate electrode GAT1 is positioned on the first gate insulating layer 141. The transistor may include the gate electrode GAT1 and the semiconductor layer SC. The first gate conductive layer is covered by a second gate insulating layer 142, the second gate conductive layer is positioned, and the second gate conductive layer includes one electrode GAT2(Cst) of a storage capacitor. One electrode GAT2(Cst) of the storage capacitor may form the storage capacitor while overlapping the gate electrode GAT1. The second gate conductive layer is covered by a first interlayer insulating layer 161, and the first data conductive layer is formed on the first interlayer insulating layer 161. The first data conductive layer may include a first connecting part SD1 respectively connected to the source region S and drain region D of the semiconductor layer SC. The first data conductive layer is covered by a first organic layer 181, and a second data conductive layer including a second connecting part SD2 is formed on the first organic layer 181. The second data conductive layer is sequentially covered by a second organic layer 182 and a third organic layer 183.

Here, the buffer layer 111, the first gate insulating layer 141, the second gate insulating layer 142, and the first interlayer insulating layer 161 may be respectively formed as an inorganic layer, and each inorganic layer may include a silicon oxide (SiOx), a silicon nitride (SiNx), or a silicon oxynitride (SiON). Meanwhile, the first organic layer 181, the second organic layer 182, and the third organic layer 183 may be organic insulating layers including an organic material, and the organic material may include one or more of a polyimide, a polyamide, an acryl resin, benzocyclobutene, and a phenol resin.

An anode (Anode) configuring one electrode of a light emitting element is formed on the third organic layer 183. The anode (Anode) may be connected to the second connecting part SD2 through an opening formed (or provided) in the second organic layer 182 and the third organic layer 183.

A pixel defining layer 380 having an opening exposing the anode (Anode) is positioned on the third organic layer 183, and in some embodiments, the pixel defining layer 380 may be made of a transparent material, or may further include a light blocking material to have a light blocking characteristic. Here, the light blocking material may include a carbon black, a carbon nanotube, a resin or paste containing black dye, a metal particle such as nickel, aluminum, molybdenum, and an alloy thereof, and a metal oxide particle (for example, chromium nitride).

A spacer 385 is formed on the pixel defining layer 380, and the spacer 385 is made of the same material as the pixel defining layer 380, which may have a transparent or light blocking characteristic, while, in some embodiments, the spacer may have a different characteristic (transparent or light blocking characteristic) from the pixel defining layer 380.

A light emitting layer EML is positioned in the opening of the pixel defining layer 380, and a functional layer FL and a cathode (Cathode) may be sequentially formed on the pixel defining layer 380 and the light emitting layer EML. Here, a portion of the functional layer FL may be positioned under the light emitting layer EML. Here, the anode (Anode), the light emitting layer EML, the functional layer FL, and the cathode (Cathode) may configure a light emitting element.

The encapsulation layer 400 is positioned on the cathode (Cathode), and the encapsulation layer 400 includes a first inorganic encapsulation layer 401, an organic encapsulation layer 402, and a second inorganic encapsulation layer 403. That is, the first inorganic encapsulation layer 401 is positioned on the cathode (Cathode), the organic encapsulation layer 402 is positioned on the first inorganic encapsulation layer 401, and the second inorganic encapsulation layer 403 is positioned on the organic encapsulation layer 402. Here, the first inorganic encapsulation layer 401 and the second inorganic encapsulation layer 403 may include a silicon oxide (SiOx), a silicon nitride (SiNx), a silicon oxynitride (SiON), or the like, and the organic encapsulation layer 402 may include one or more of a polyimide, a polyamide, an acrylic resin, benzocyclobutene, and a phenol resin.

The touch sensing part TS receives a touch input from outside the display device. Within the touch sensing part TS, sensing insulating layers 501, 510, and 511 and sensing electrodes 540 and 541 are positioned on the second inorganic encapsulation layer 403. The lower sensing insulating layer 501 is positioned on the second inorganic encapsulation layer 403, the lower sensing electrode 541 is positioned thereon, the intermediate sensing insulating layer 510 is positioned thereon, the upper sensing electrode 540 is positioned thereon, and the upper sensing electrode 540 is positioned thereon, and the upper sensing insulating layer 511 is positioned thereon. The sensing electrodes 540 and 541 are positioned above the display area DA, and a connecting wire 540-1 electrically connected to the sensing electrode 540, which is one of the sensing electrodes, is formed in the non-display area PA. The connecting wire 540-1 may be electrically connected to the driver 50.

A light blocking member 220 and a color filter 230 are positioned on the upper sensing insulating layer 511. The color filter 230 may be positioned only in the display area DA, and the light blocking member 220 extends to the first non-display area PA1 in addition to the display area DA.

A planarization layer 550 is positioned on the light blocking member 220 and the color filter 230. The planarization layer 550 is for planarizing the upper surface of the display panel DP, and may be a transparent organic insulating layer including at least one of polyimide, polyamide, an acryl resin, benzocyclobutene, and a phenol resin.

The structure of the display area DA has been briefly described above.

A plurality of dams D1 and D2 may be included in the non-display area PA adjacent to the display area DA. Although two dams (one first dam D1 and one second dam D2) are illustrated in FIG. 4, each dam may be formed in plural. In addition, in some embodiments, three dams (two first dams D1 and one second dam D2) may be formed. The plurality of dams D1 and D2 are formed on a plurality of inorganic layers (the buffer layer 111, the first gate insulating layer 141, the second gate insulating layer 142, and the first interlayer insulating layer 161) extending from the display area DA.

The first dam D1 may be positioned closer to the display area DA than the second dam D2, and the first dam D1 may have a lower height than the second dam D2.

The first dam D1 may include a (1-1)-th sub-dam 1821 and a (1-2)-th sub-dam 3851. The (1-1)-th sub-dam 1821 may be positioned on the same layer and may include the same material as the second organic layer 182 positioned in the display area DA. The (1-1)-th sub-dam 1821 may be formed in the same process as the second organic layer 182 positioned in the display area DA. The (1-2)-th sub-dam 3851 may be positioned on the same layer and may include the same material as the spacer 385 positioned in the display area DA. The (1-2)-th sub-dam 3851 may be formed in the same process as the spacer 385 positioned in the display area DA. As being formed in a same process and/or as including a same material, elements may be in a same layer as each other as respective portions of a same material layer, may be on a same layer by forming an interface with a same underlying or overlying layer, etc., without being limited thereto.

The second dam D2 may include a (2-1)-th sub-dam 1812, a (2-2)-th sub-dam 1822, and a (2-3)-th sub-dam 3852. The (2-1)-th sub-dam 1812 may be positioned on the same layer and may include the same material as the first organic layer 181 positioned in the display area DA. The (2-1)-th sub-dam 1812 may be formed in the same process as the first organic layer 181 positioned in the display area DA. The (2-2)-th sub-dam 1822 may be positioned on the same layer and may include the same material as the second organic layer 182 positioned in the display area DA. The (2-2)-th sub-dam 1822 may be formed in the same process as the second organic layer 182 positioned in the display area DA. The (2-3)-th sub-dam 3852 may be positioned on the same layer and may include the same material as the spacer 385 positioned in the display area DA. The (2-3)-th sub-dam 3852 may be formed in the same process as the spacer 385 positioned in the display area DA.

FIG. 4 shows the embodiment in which the first dam D1 is formed in a double-layered structure and the second dam D2 is formed in a triple-layered structure. However, the invention is not limited thereto, and the first dam D1 may be formed in a triple-layered structure, and the second dam D2 may be formed in a quadruple-layered structure.

In addition, the first inorganic encapsulation layer 401 extending from the display area DA is positioned on each of the dams D1 and D2. In addition, the organic encapsulation layer 402 extending from the display area DA is positioned on the first inorganic encapsulation layer 401, and the organic encapsulation layer 402 may be positioned on the first dam D1, but the organic encapsulation layer 402 may not be positioned on the second dam D2. The first dam D1 may control spreading of a material in the process of forming the organic encapsulation layer 402. The organic encapsulation layer 402 may have a shape to fill a space between an end of the display area DA and the first dam D1. The second inorganic encapsulation layer 403 overlapping the front surface of the substrate 110 may be positioned on the organic encapsulation layer 402. The first inorganic encapsulation layer 401 has a structure in contact with the second inorganic encapsulation layer 403, on the second dam D2 where the organic encapsulation layer 402 is not positioned. The first inorganic encapsulation layer 401 is in contact with the second inorganic encapsulation layer 403 to block moisture and oxygen from the outside.

The sensing insulating layers 501, 510, and 511 and the connecting wire 540-1 may be positioned on the second inorganic encapsulation layer 403 positioned on the dams D1 and D2, and the light blocking member 220 and the planarization layer 550 may be positioned on the upper sensing insulating layer 511.

The light blocking member 220 and the planarization layer 550 may be continuously formed up to the first non-display area PA1, and may be positioned only in some area in the other non-display area PA, and may not be positioned in the bending area and the pad area (the pad part for the driver (IC Pad) and the pad part for the circuit board (FPCB Pad)).

Hereinafter, a structure of the pad part (the pad part for the driver (IC Pad) and the pad part for the circuit board (FPCB Pad)) according to FIG. 4 will be described.

To summarize the structure of the pad part, the pad part is configured of a conductive part and an insulating part having (or defining) an opening exposing the conductive part to outside the insulating part, where the insulating part may be divided into a first insulating part (e.g., a first insulating layer) having a first opening and a second insulating part (e.g., second insulating layer) having a second opening which is wider than the first opening.

In an embodiment, the first insulating layer and the second insulating layer may be in order from the conductive part, or the second insulating layer may face the conductive part with a portion of the first insulating layer therebetween. In an embodiment, the second opening overlaps (or corresponds to) the first opening in a plan view, and exposes an upper surface of the first insulating part. In an embodiment, the second opening which is wider than the first opening, defines the opening of the insulating part together with the first opening. Hereinafter, a structure of each pad part will be described.

The conductive part of the pad part for the driver (IC pad) is illustrated as having a triple-layered structure. The pad part for the driver (IC Pad) includes a second additional pad electrode GAT1-P1 formed as (or in a same layer as) the first gate conductive layer GAT1, a first additional pad electrode SD1-P1 formed as the first data conductive layer SD1, and a first pad electrode SD2-P1 formed as the second data conductive layer SD2. The first gate insulating layer 141 is positioned under the second additional pad electrode GAT1-P1, and the second gate insulating layer 142 and the first interlayer insulating layer 161 are positioned between the second additional pad electrode GAT1-P1 and the first additional pad electrode SD1-P1. The first inorganic encapsulation layer 401, the second inorganic encapsulation layer 403, the lower sensing insulating layer 501, and the intermediate sensing insulating layer 510 may be positioned on the first pad electrode SD2-P1. In some embodiments, at least one of the first inorganic encapsulation layer 401, the second inorganic encapsulation layer 403, the lower sensing insulating layer 501, the intermediate sensing insulating layer 510, and the upper sensing insulating layer 511 is positioned on the first pad electrode SD2-P1. In some embodiments, the pad part for the driver (IC Pad) may have a single-layered structure or a double-layered structure, or may have a stacked structure of quadruple-layered structure or more.

On the other hand, the conductive part of the pad part for the circuit board (FPCB Pad) is shown as having a double-layered structure. The pad part for the circuit board (FPCB Pad) may include a first additional pad electrode SD1-P2 formed as the first data conductive layer SD1, and a first pad electrode SD2-P2 formed as the second data conductive layer SD2. In the pad part for the circuit board (FPCB Pad), the first inorganic encapsulation layer 401, the second inorganic encapsulation layer 403, the lower sensing insulating layer 501, and the intermediate sensing insulating layer 510 may be positioned on the first pad electrode SD2-P2. In some embodiments, at least one of the first inorganic encapsulation layer 401, the second inorganic encapsulation layer 403, the lower sensing insulating layer 501, the intermediate sensing insulating layer 510, and the upper sensing insulating layer 511 is positioned on the first pad electrode SD2-P2. In some embodiments, the pad part for the circuit board (FPCB Pad) may have a single-layered structure, or may have a stacked structure of triple-layered structure or more.

Hereinafter, the stacked structure of the display area DA and the stacked structure of the pad part PAD described with reference to FIG. 4 will be examined in more detail, and the structure of the encapsulation layer 400 and the touch sensing part TS of the stacked structure of the display area DA according to the embodiment will be first described with reference to FIG. 5, and then the structure and manufacturing method of the pad part PAD corresponding thereto will be described.

Figure 5:
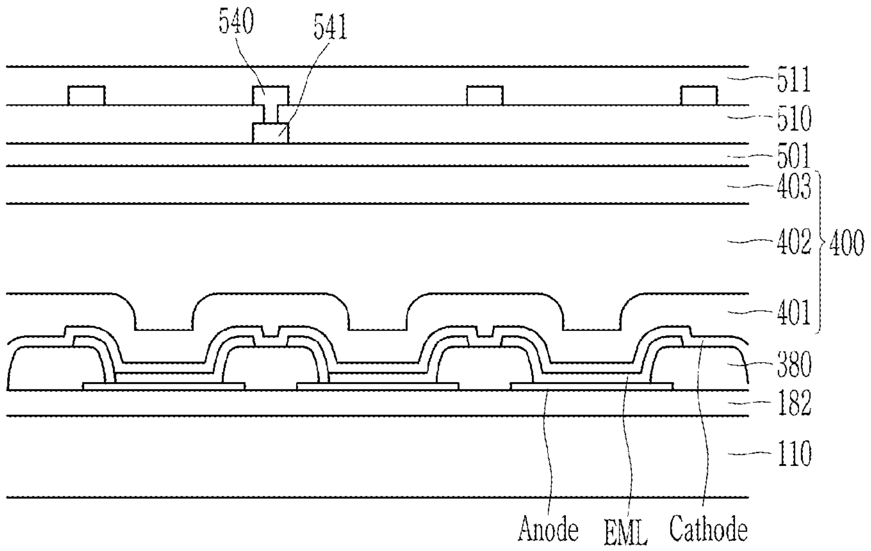
FIG. 5 illustrates a schematic cross-sectional view of a display area of a display panel according to an embodiment.

FIG. 5 illustrates a schematic cross-sectional view of a display area DA of a display panel DP according to an embodiment.

In FIG. 5, the structure positioned between the substrate 110 and the second organic layer 182 is omitted, and an upper part of the second organic layer 182 is mainly shown.

The anode (Anode) configuring one electrode of the light emitting element is formed on the second organic layer 182. The pixel defining layer 380 having an opening exposing the anode (Anode) to outside the pixel defining layer 380 is positioned on the second organic layer 182, and the light emitting layer EML is positioned in the opening of the pixel defining layer 380. The cathode (Cathode) is positioned on the pixel defining layer 380 and on the emission layer EML, and the anode (Anode), the light emitting layer EML, and the cathode (Cathode) may configure a light emitting element.

The encapsulation layer 400 is positioned on the cathode (Cathode), the first inorganic encapsulation layer 401 is positioned on the cathode (Cathode), the organic encapsulation layer 402 is positioned on the first inorganic encapsulation layer 401, and the second inorganic encapsulation layer 403 is positioned on the organic encapsulation layer 402.

The lower sensing insulating layer 501 is positioned on the second inorganic encapsulation layer 403, the lower sensing electrode 541 is positioned thereon, the intermediate sensing insulating layer 510 is positioned thereon, the upper sensing electrode 540 is positioned thereon, and the upper sensing electrode 540 is positioned thereon, and the upper sensing insulating layer 511 is positioned thereon. The lower sensing electrode 541 and the upper sensing electrode 540 are connected to each other through an opening positioned in the intermediate sensing insulating layer 510. The sensing electrodes 540 and 541 may overlap the pixel defining layer 380 in a plan view, so that light emitted from the light emitting element may not be blocked.

A structure above the upper sensing insulating layer 511 may be the same as that of FIG. 4.

Hereinafter, the pad part for the driver (IC pad) will be described with reference to FIG. 6 to FIG. 13.

First, a manufacturing method of the pad part for the driver (IC Pad; hereinafter also referred to as a first pad part) will be described with reference to FIG. 6 to FIG. 10.

FIG. 6 to FIG. 10 sequentially illustrate a manufacturing method of a first pad part according to an embodiment.

The manufacturing method of the first pad part is summarized as follows.

The method of manufacturing (or providing) the first pad part may include forming the first insulating part and the second insulating part covering the conductive part of the pad part positioned in the non-display area PA among the display area DA and the non-display area PA, forming a second opening exposing the first insulating part in the second insulating part, forming an additional insulating layer covering the second insulating part and the exposed first insulating part, forming a first opening narrower than the second opening in the additional insulating layer and the first insulating part, and removing a portion of (or entirety of) the additional insulating layer. In the following embodiment, the additional insulating layer may correspond to the upper sensing insulating layer 511.

In the pad part for the driver (IC Pad), the second additional pad electrode GAT1-P1, the first additional pad electrode SD1-P1, and the first pad electrode SD2-P1 configure a conductive part that transmits a voltage, and a process of exposing the conductive part by opening the insulating part positioned around the conductive part is shown in FIG. 6 to FIG. 10.

Figure 6:
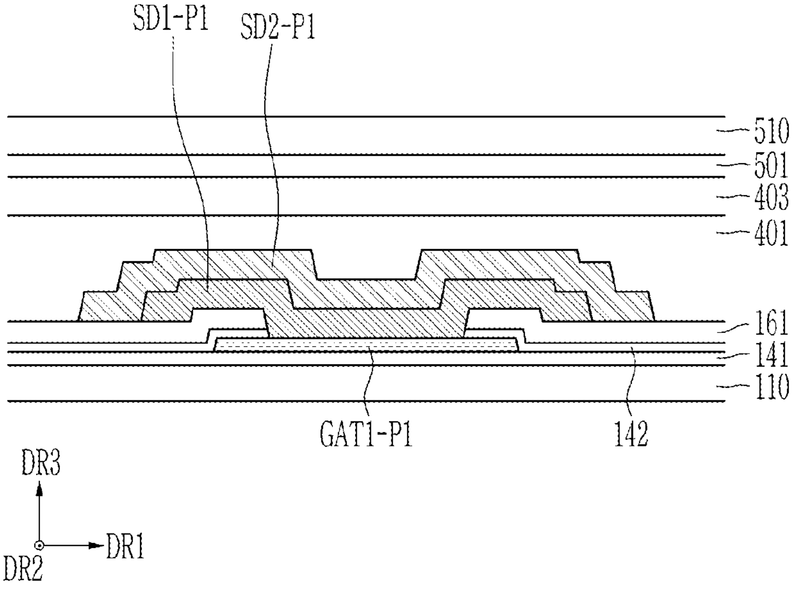
FIG. 6 to FIG. 10 sequentially illustrate a method of manufacturing (or providing) a first pad part according to an embodiment.

FIG. 6 illustrates the structure of the pad part for the driver (IC Pad) in steps of forming the first inorganic encapsulation layer 401, the second inorganic encapsulation layer 403, the lower sensing insulating layer 501, and the intermediate sensing insulating layer 510 on the cathode (Cathode) in the display area DA, and a process of forming the conductive part including the second additional pad electrode GAT1-P1, the first additional pad electrode SD1-P1, and the first pad electrode SD2-P1 is formed will now be described with reference to the steps before the cathode (Cathode) is formed.

The first gate insulating layer 141 is positioned on the substrate 110, and the second additional pad electrode GAT1-P1 formed as the first gate conductive layer is formed on the first gate insulating layer 141. The second gate insulating layer 142 and the first interlayer insulating layer 161 having an opening exposing the second additional pad electrode GAT1-P1 are sequentially positioned on the second additional pad electrode GAT1-P1. The first additional pad electrode SD1-P1 formed as the first data conductive layer is positioned on the first interlayer insulating layer 161, and the first pad electrode SD2-P1 formed as the second data conductive layer is formed on the first additional pad electrode SD1-P1.

In the display area DA, the first organic layer 181, the second organic layer 182, the third organic layer 183, and the pixel defining layer 380 are formed as insulating parts on the first data conductive layer and/or the second data conductive layer, but the corresponding insulating layer is removed around the pad part for the driver (IC Pad), and the part configuring the light emitting element is also removed.

Thereafter, as shown in FIG. 6, the first inorganic encapsulation layer 401, the second inorganic encapsulation layer 403, the lower sensing insulating layer 501, and the intermediate sensing insulating layer 510 are sequentially stacked on the exposed first pad electrode SD2-P1.

Figure 7:
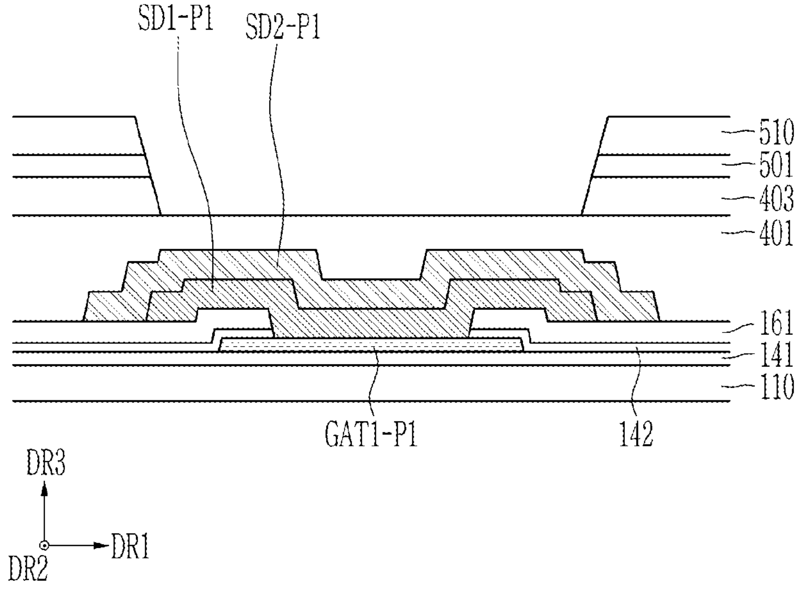

Thereafter, as shown in FIG. 7, an opening is formed in the second inorganic encapsulation layer 403, the lower sensing insulating layer 501, and the intermediate sensing insulating layer 510 to expose the first inorganic encapsulation layer 401. A process of FIG. 7 may be the same process as the process of exposing the lower sensing electrode 541 by forming the opening in the intermediate sensing insulating layer 510 in the display area DA. Therefore, a step of forming the second opening in the second insulating part may be performed together when the second inorganic encapsulation layer 403 is etched, while such step may be performed together when the lower sensing insulating layer 501 or the intermediate sensing insulating layer 510 is etched. Referring to FIG. 7, for example, a method may include etching of the second inorganic encapsulation layer 403 in the display area DA and the providing of the opening in the second insulating layer (e.g., 403, 501 and/or 510) in the non-display area PA is performed together with the etching of the second inorganic encapsulation layer 403.

Figure 8:
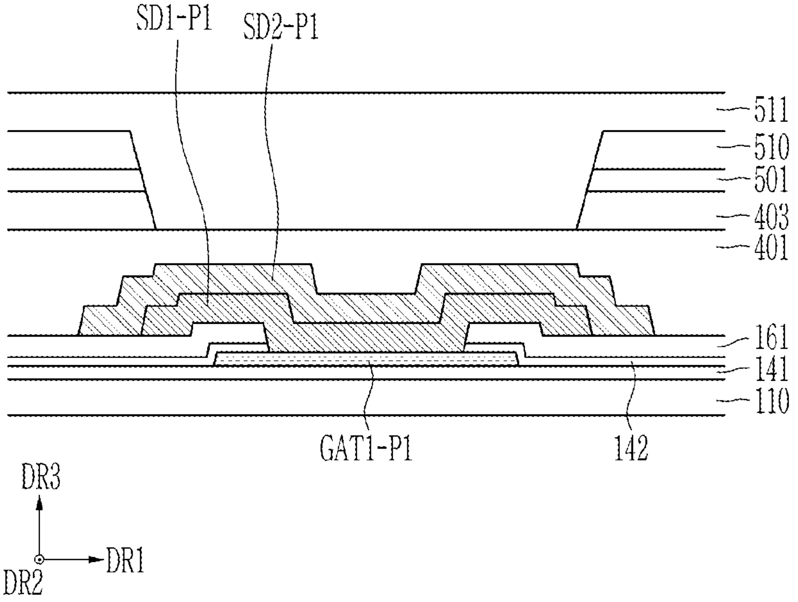

Thereafter, as shown in FIG. 8, the upper sensing insulating layer 511 covering the intermediate sensing insulating layer 510 and the exposed first inorganic encapsulation layer 401 is formed.

Figure 9:
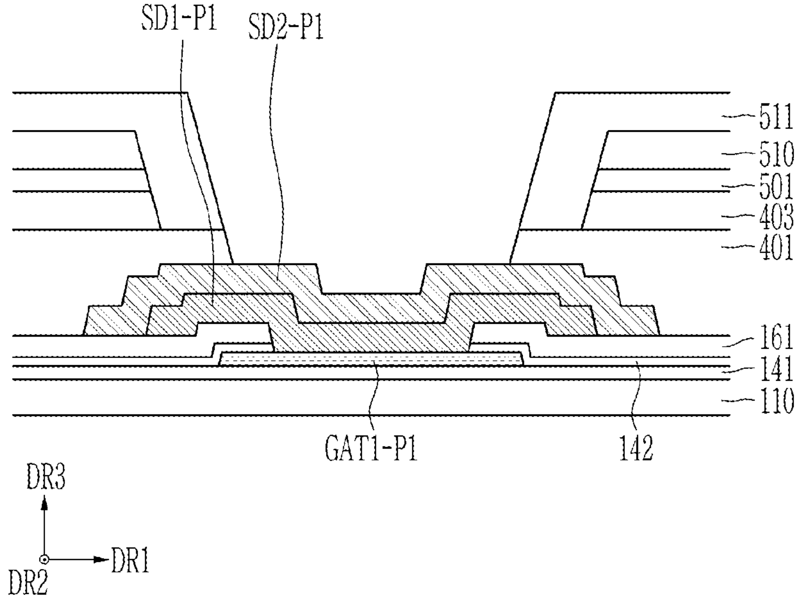

Thereafter, as shown in FIG. 9, an opening is formed in the upper sensing insulating layer 511 and the first inorganic encapsulation layer 401 to expose the first pad electrode SD2-P1, which is the uppermost layer of the conductive part. A process of FIG. 9 may be the same process as the process of forming the opening in the upper sensing insulating layer 511 in the display area DA, and may be the same process as a process of forming an opening exposing a pad part for a touch sensing part, which will be described later.

Figure 10:
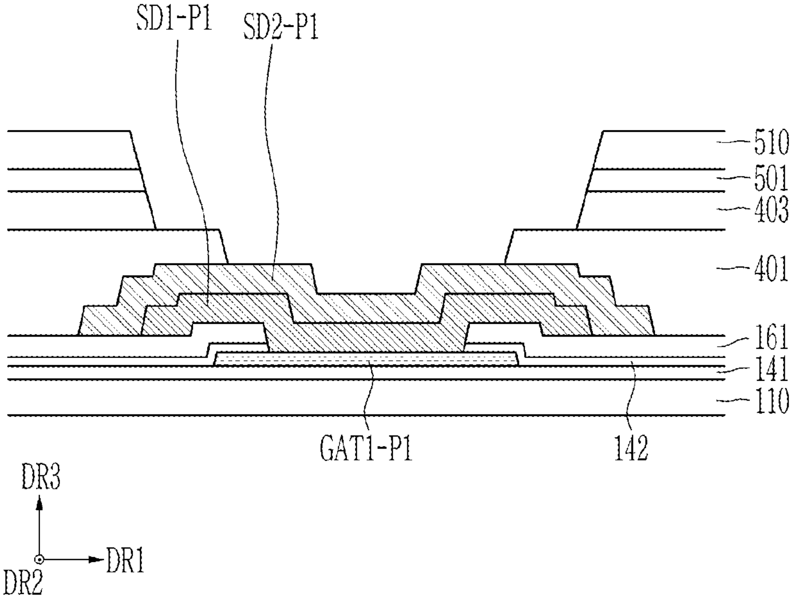

Thereafter, as shown in FIG. 10, the upper sensing insulating layer 511 (e.g., a remaining portion) is removed to complete the pad part for the driver (IC pad) according to the embodiment of FIG. 4. Referring to FIG. 9, an opening formed in the upper sensing insulating layer 511 and the first inorganic encapsulation layer 401 may be narrower than the opening formed in the second inorganic encapsulation layer 403, the lower sensing insulating layer 501, and the intermediate sensing insulating layer 510 in FIG. 7.

Due to a difference of the size of the opening, an insulating part having a step is formed in FIG. 10. That is, in the following description, the insulating part positioned above the conductive part is divided into a first insulating part and a second insulating part, the insulating part having a narrower opening (e.g., first opening) is referred to as the first insulating part (e.g., first insulating layer or first thickness portion), and the insulating part having a wider opening (e.g., second opening) is referred to as the second insulating part (e.g., second insulating layer or second thickness portion). In a process of exposing the conductive part by opening the insulating part positioned around the conductive part, the wider opening in an upper layer (e.g., 403, 501 and/or 510) may be provided before providing of the narrower opening in a lower layer under the upper layer. Here, since a portion of the additional insulating layer (e.g., the upper sensing insulating layer 511) remains extended along a sidewall of the upper layer at the pad part opening during etching of the lower layer (e.g., 401) delamination and/or cracking of the upper layer may be reduced or effectively prevented.

In the embodiment of FIG. 10, the first insulating part includes only the first inorganic encapsulation layer 401, and the second insulating part includes the second inorganic encapsulation layer 403, the lower sensing insulating layer 501, and the intermediate sensing insulating layer 510. In an embodiment, the first insulating part and the first inorganic encapsulation layer 401 may be respective portions of a same first inorganic layer (or same first material layer), and the second insulating part and the second inorganic encapsulation layer 403 may be respective portions of a same second inorganic layer (or same second material layer).

In some embodiments, the upper sensing insulating layer 511 may not be removed and may have the cross-sectional structure of FIG. 9, and in some embodiments, at least one of the first inorganic encapsulation layer 401, the second inorganic encapsulation layer 403, the lower sensing insulating layer 501, and the intermediate sensing insulating layers 510 may not be formed.

Meanwhile, in some embodiments, the first inorganic encapsulation layer 401, the second inorganic encapsulation layer 403, the lower sensing insulating layer 501, the intermediate sensing insulating layer 510, and the upper sensing insulating layer 511 may be inorganic insulating layers or organic layers, and when they are the inorganic insulating layers, they may include a silicon oxide (SiOx), a silicon nitride (SiNx), a silicon oxynitride (SiON), or the like, while when they are the organic layers, they may include at least one of a polyimide, a polyamide, an acrylic resin, benzocyclobutene, and a phenol resin.

In the above description, the structure in which the pad part for the driver (IC Pad) includes the second additional pad electrode GAT1-P1, the first additional pad electrode SD1-P1, and the first pad electrode SD2-P1 together as conductive part, and the first insulating part thereof includes the first inorganic encapsulation layer 401, and the second insulating part includes the second inorganic encapsulation layer 403, the lower sensing insulating layer 501, and the intermediate sensing insulating layer 510 together as the insulating part, has been mainly described. In some embodiments, the conductive part of the pad part for the driver (IC Pad) may be formed by using various conductive layers, and may be formed as a single conductive layer or two or more conductive layers.

Hereinafter, a structure of a pad part for a driver (IC Pad) according to an embodiment will be described with reference to FIG. 11 to FIG. 14.

FIG. 11 to FIG. 14 respectively illustrate a cross-sectional structure of a first pad part according to an embodiment.

Figure 11:
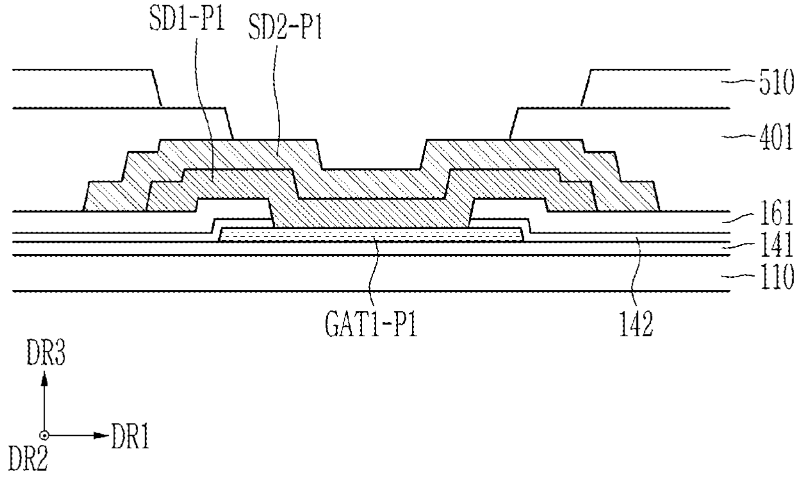
FIG. 11 to FIG. 14 respectively illustrate a cross-sectional structure of a first pad part according to an embodiment.

Unlike FIG. 10, the pad part for the driver (IC Pad) according to the embodiment of FIG. 11 is an embodiment in which the second inorganic encapsulation layer 403 and the lower sensing insulating layer 501 are removed, and in the embodiment of FIG. 11, the first insulating part includes only the first inorganic encapsulation layer 401, and the second insulating part includes only the intermediate sensing insulating layer 510.

Figure 12:
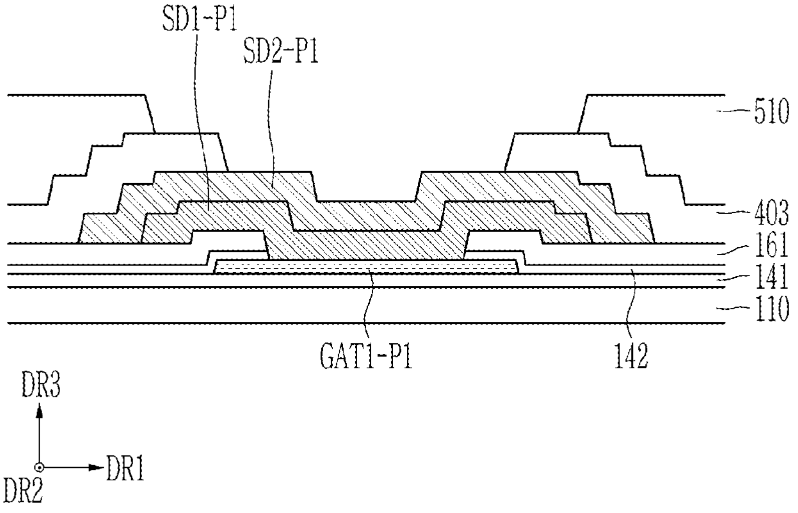

Meanwhile, unlike FIG. 10, the pad part for the driver (IC Pad) according to the embodiment of FIG. 12 is an embodiment in which the first inorganic encapsulation layer 401 and the lower sensing insulating layer 501 are removed, and in the embodiment of FIG. 12, the first insulating part includes only the second inorganic encapsulation layer 403, and the second insulating part includes only the intermediate sensing insulating layer 510. A variation of FIG. 12 may include at least one of the lower sensing insulating layer 501 and the intermediate sensing insulating layer 510 as the second insulating part.

Figure 13:
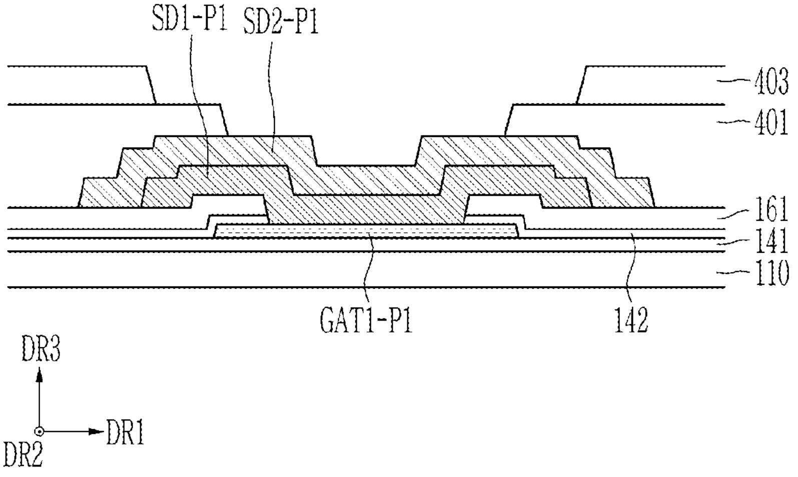

Meanwhile, unlike FIG. 10, the pad part for the driver (IC Pad) according to the embodiment of FIG. 13 is an embodiment in which the lower sensing insulating layer 501 and the intermediate sensing insulating layer 510 are removed, and in the embodiment of FIG. 13, the first insulating part includes only the first inorganic encapsulation layer 401, and the second insulating part includes only the second inorganic encapsulation layer 403.

Figure 14:
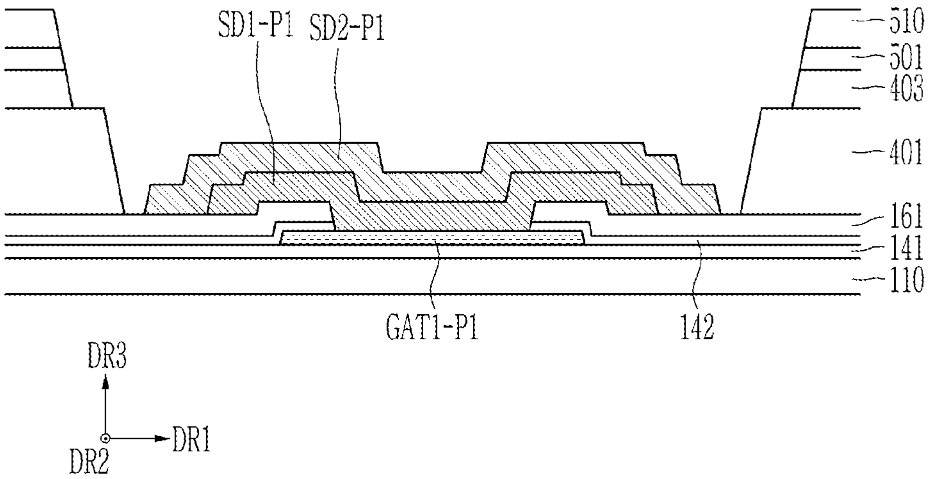

On the other hand, the embodiment of FIG. 14 is an embodiment in which the openings of the first insulating part and the second insulating part are formed wider than the embodiment of FIG. 10, and all the conductive parts thereof are exposed by the first insulating part and the second insulating part. In FIG. 14, the first inorganic encapsulation layer 401 includes a sidewall defining the first opening. The sidewall is spaced apart from the conductive part and exposes the first interlayer insulating layer 161 to outside the insulating part.

Even in the embodiment of FIG. 14, the stacked structure of the insulating part may be changed as shown in FIG. 11 to FIG. 13.

The changed embodiment of FIG. 11 to FIG. 14 is only a portion of the changeable embodiment, and numerous variations may be possible.

Hereinafter, a pad part for a circuit board (FPCB Pad; hereinafter also referred to as a second pad part) will be described with reference to FIG. 15 to FIG. 23.

First, a manufacturing method of the pad part for the circuit board (FPCB Pad) will be described with reference to FIG. 15 to FIG. 19.

FIG. 15 to FIG. 19 sequentially illustrate a manufacturing method of the second pad part according to the embodiment.

The manufacturing method of the second pad part is summarized as follows.

The manufacturing method of the second pad part may include forming the first insulating part and the second insulating part covering the conductive part of the pad part positioned in the non-display area PA among the display area DA and the non-display area PA, forming a second opening exposing the first insulating part in the second insulating part, forming an additional insulating layer covering the second insulating part and the exposed first insulating part, forming a first opening rather than a second opening in the additional insulating layer and the first insulating part, and removing the additional insulating layer. In the following embodiment, the additional insulating layer may correspond to the upper sensing insulating layer 511.

In the pad part for the circuit board (FPCB Pad), the first additional pad electrode SD1-P2 and the first pad electrode SD2-P2 configure a conductive part that transmits a voltage, and a process of exposing the conductive part by opening the insulating part positioned around the conductive part is shown in FIG. 15 to FIG. 19.

Figure 15:
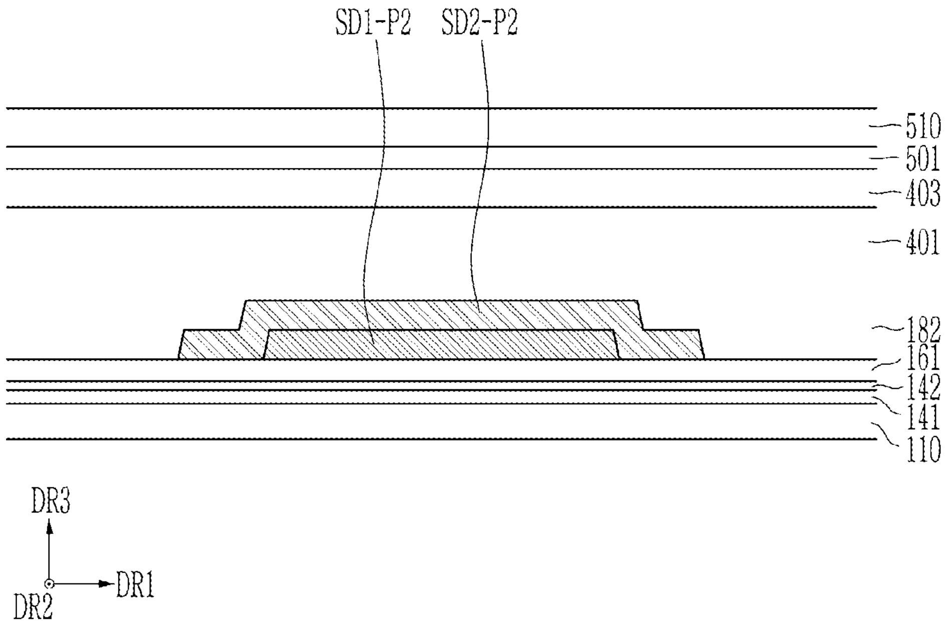
FIG. 15 to FIG. 19 sequentially illustrate a method of manufacturing (or providing) a second pad part according to an embodiment.

FIG. 15 illustrates the structure of the pad part for the circuit board (FPCB Pad) in steps of forming the first inorganic encapsulation layer 401, the second inorganic encapsulation layer 403, the lower sensing insulating layer 501, and the intermediate sensing insulating layer 510 on the cathode (Cathode) in the display area DA, and a process of forming the conductive part including the first additional pad electrode SD1-P2 and the first pad electrode SD2-P2 is formed will now be described with reference to the steps before the cathode (Cathode) is formed.

The first gate insulating layer 141, the second gate insulating layer 142, and the first interlayer insulating layer 161 are sequentially positioned on the substrate 110, the first additional pad electrodes SD1-P2 formed as the first data conductive layer are positioned on the first interlayer insulating layer 161, and the first pad electrode SD2-P2 formed as the second data conductive layer is formed on the first additional pad electrode SD1-P2.

In the display area DA, the first organic layer 181, the second organic layer 182, the third organic layer 183, and the pixel defining layer 380 are formed as insulating parts on the first data conductive layer and/or the second data conductive layer, but the corresponding insulating layer is removed around the pad part for the circuit board (FPCB Pad), and the part configuring the light emitting element is also removed.

Thereafter, as shown in FIG. 15, the first inorganic encapsulation layer 401, the second inorganic encapsulation layer 403, the lower sensing insulating layer 501, and the intermediate sensing insulating layer 510 are sequentially stacked on the exposed first pad electrode SD2-P2.

Figure 16:
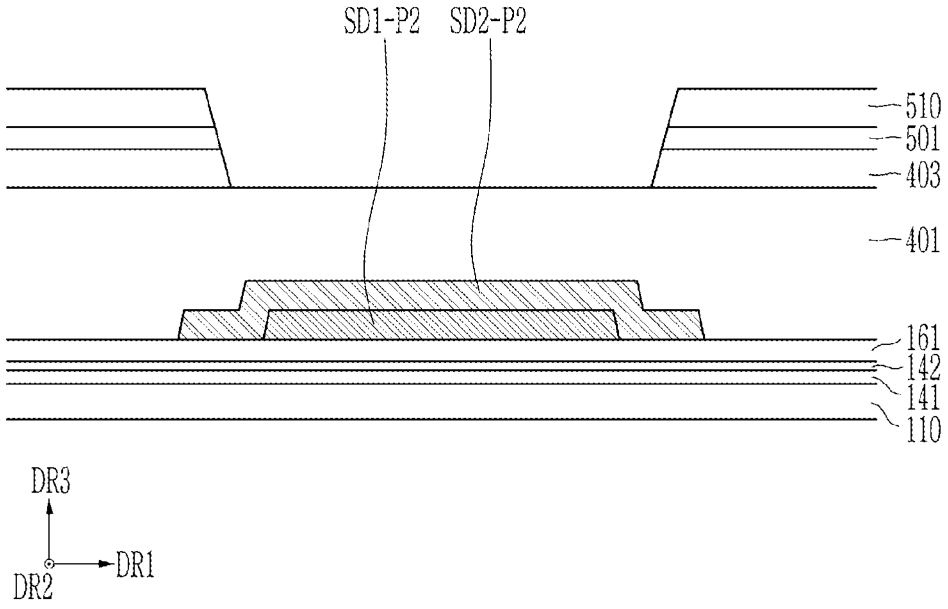

Thereafter, as shown in FIG. 16, an opening is formed in the second inorganic encapsulation layer 403, the lower sensing insulating layer 501, and the intermediate sensing insulating layer 510 to expose the first inorganic encapsulation layer 401. A process of FIG. 16 may be the same process as the process of exposing the lower sensing electrode 541 by forming the opening in the intermediate sensing insulating layer 510 in the display area DA. Therefore, a step of forming the second opening in the second insulating part may be performed together when the second inorganic encapsulation layer 403 is etched, while such step may be performed together when the lower sensing insulating layer 501 or the intermediate sensing insulating layer 510 is etched.

Figure 17:
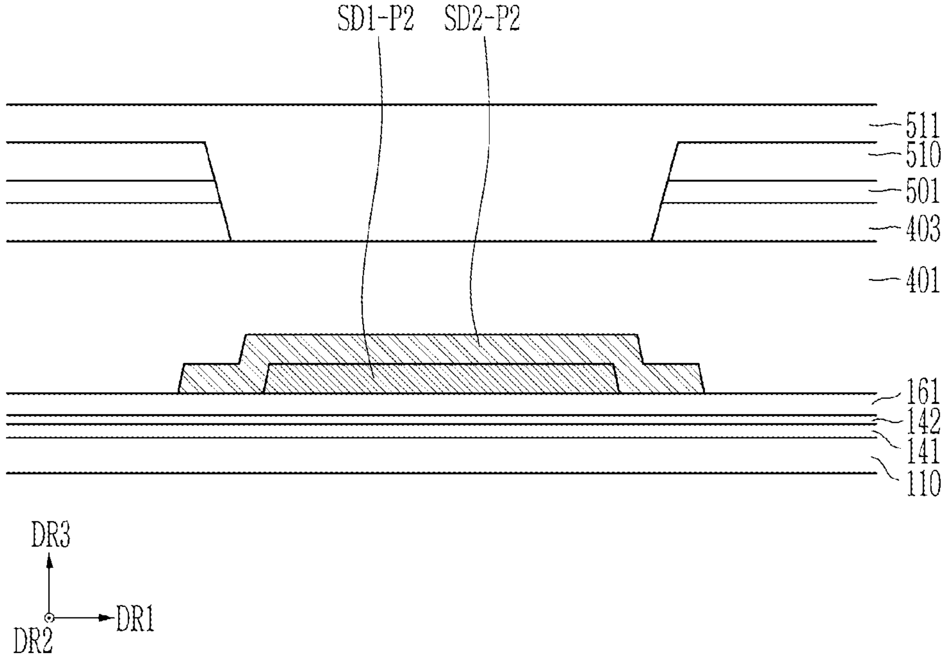

Thereafter, as shown in FIG. 17, the upper sensing insulating layer 511 covering the intermediate sensing insulating layer 510 and the exposed first inorganic encapsulation layer 401 is formed.

Figure 18:
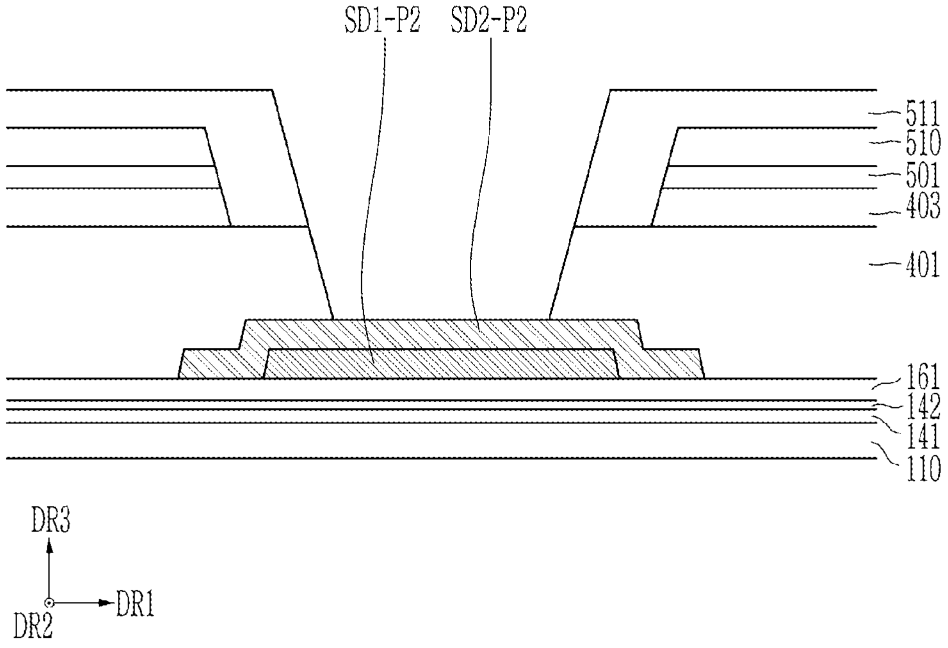

Thereafter, as shown in FIG. 18, an opening is formed in the upper sensing insulating layer 511 and the first inorganic encapsulation layer 401 to expose the first pad electrode SD2-P2, which is the uppermost layer of the conductive part. A process of FIG. 18 may be the same process as the process of forming the opening in the upper sensing insulating layer 511 in the display area DA, and may be the same process as a process of forming an opening exposing a pad part for a touch sensing part, which will be described later.

Figure 19:
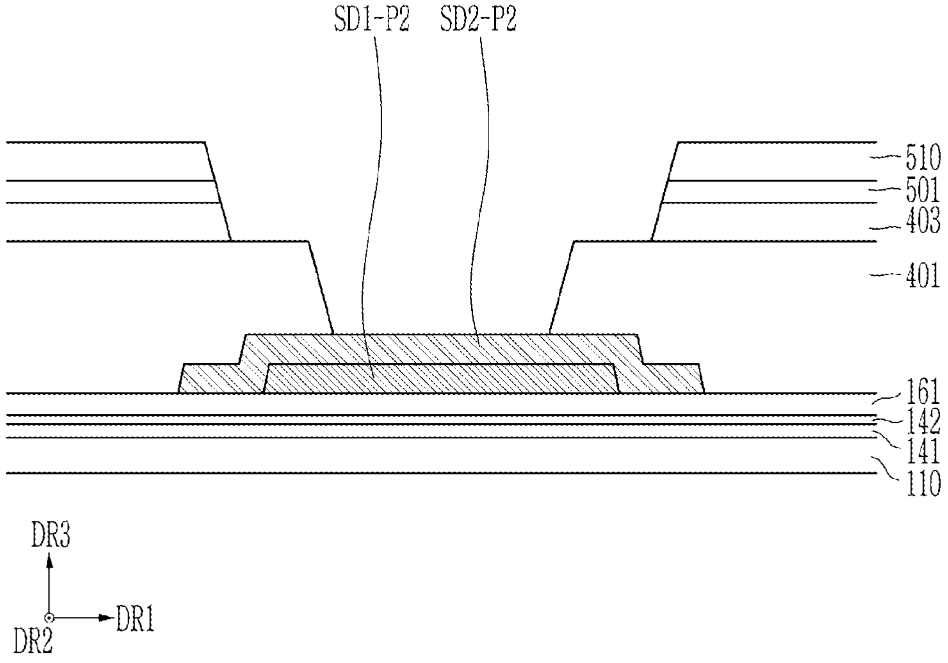

Thereafter, as shown in FIG. 19, the upper sensing insulating layer 511 is removed to complete the pad part for the circuit board (FPCB Pad) according to the embodiment of FIG. 4. Referring to FIG. 18, an opening formed in the upper sensing insulating layer 511 and the first inorganic encapsulation layer 401 may be narrower than the opening formed in the second inorganic encapsulation layer 403, the lower sensing insulating layer 501, and the intermediate sensing insulating layer 510 in FIG. 16. Due to a difference of the size of the opening, an insulating part having a step is formed in FIG. 19. In the embodiment of FIG. 19, the first insulating part having a narrow opening includes only the first inorganic encapsulation layer 401, and the second insulating part having a relatively wide opening includes the second inorganic encapsulation layer 403, the lower sensing insulating layer 501, and the intermediate sensing insulating layer 510.

In some embodiments, the upper sensing insulating layer 511 may not be removed and may have the cross-sectional structure of FIG. 18, and in some embodiments, at least one of the first inorganic encapsulation layer 401, the second inorganic encapsulation layer 403, the lower sensing insulating layer 501, and the intermediate sensing insulating layers 510 may not be formed.

Meanwhile, in some embodiments, the first inorganic encapsulation layer 401, the second inorganic encapsulation layer 403, the lower sensing insulating layer 501, the intermediate sensing insulating layer 510, and the upper sensing insulating layer 511 may be inorganic insulating layers or an organic layers, and when they are the inorganic insulating layers, they may include a silicon oxide (SiOx), a silicon nitride (SiNx), a silicon oxynitride (SiON), or the like, while when they are the organic layers, they may include at least one of a polyimide, a polyamide, an acrylic resin, benzocyclobutene, and a phenol resin.

In the above description, the structure in which the pad part for the circuit board (FPCB Pad) includes the first additional pad electrode SD1-P2 and the first pad electrode SD2-P2 as conductive parts, and the first insulating part thereof includes the first inorganic encapsulation layer 401, and the second insulating part includes the second inorganic encapsulation layer 403, the lower sensing insulating layer 501, and the intermediate sensing insulating layer 510, has been mainly described. In some embodiments, the conductive part of the pad part for the circuit board (FPCB Pad) may be formed by using various conductive layers, and may be formed as a single conductive layer or three or more conductive layers.

Hereinafter, a structure of a pad part for a circuit board (FPCB Pad) according to an embodiment will be described with reference to FIG. 20 to FIG. 23.

FIG. 20 to FIG. 23 respectively illustrate a cross-sectional structure of a second pad part according to an embodiment.

Figure 20:
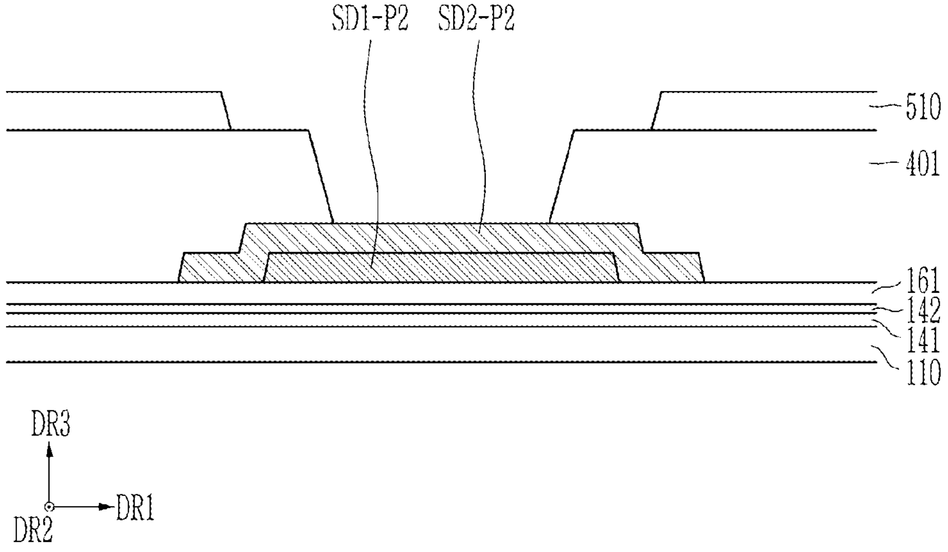
FIG. 20 to FIG. 23 respectively illustrate a cross-sectional structure of a second pad part according to an embodiment.

Unlike FIG. 19, the pad part for the circuit board (FPCB Pad) according to the embodiment of FIG. 20 is an embodiment in which the second inorganic encapsulation layer 403 and the lower sensing insulating layer 501 are removed, and in the embodiment of FIG. 20, the first insulating part includes only the first inorganic encapsulation layer 401, and the second insulating part includes only the intermediate sensing insulating layer 510.

Figure 21:
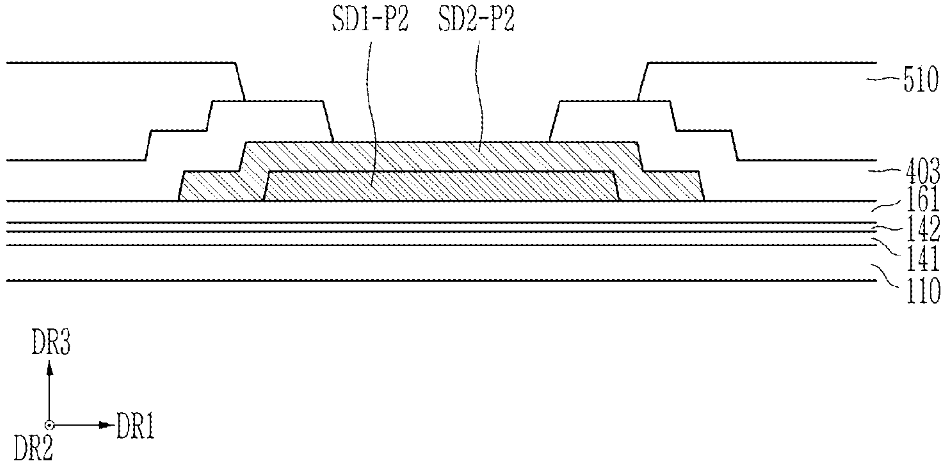

Meanwhile, unlike FIG. 19, the pad part for the circuit board (FPCB Pad) according to the embodiment of FIG. 21 is an embodiment in which the first inorganic encapsulation layer 401 and the lower sensing insulating layer 501 are removed, and in the embodiment of FIG. 21, the first insulating part includes only the second inorganic encapsulation layer 403, and the second insulating part includes only the intermediate sensing insulating layer 510.

Figure 22:
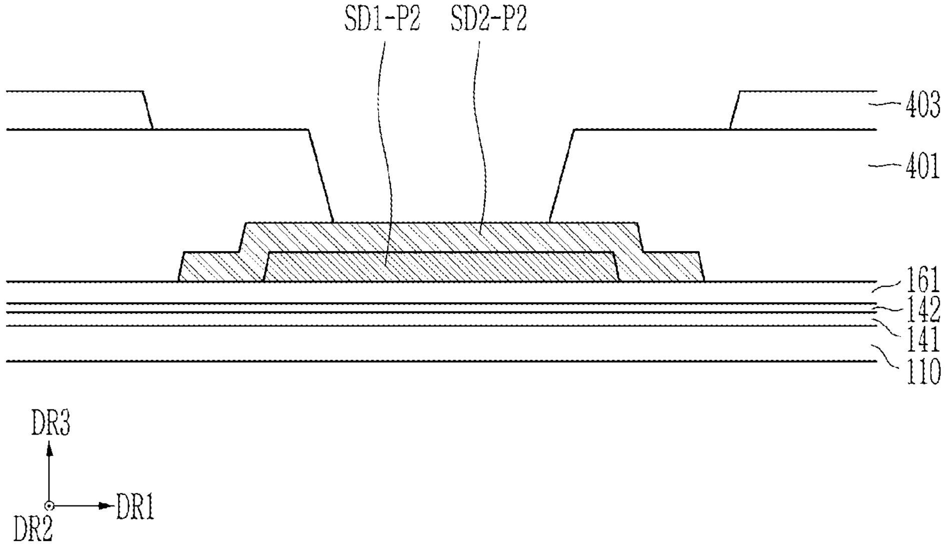

Meanwhile, unlike FIG. 19, the pad part for the circuit board (FPCB Pad) according to the embodiment of FIG. 22 is an embodiment in which the lower sensing insulating layer 501 and the intermediate sensing insulating layer 510 are removed, and in the embodiment of FIG. 22, the first insulating part includes only the first inorganic encapsulation layer 401, and the second insulating part includes only the second inorganic encapsulation layer 403.

Figure 23:
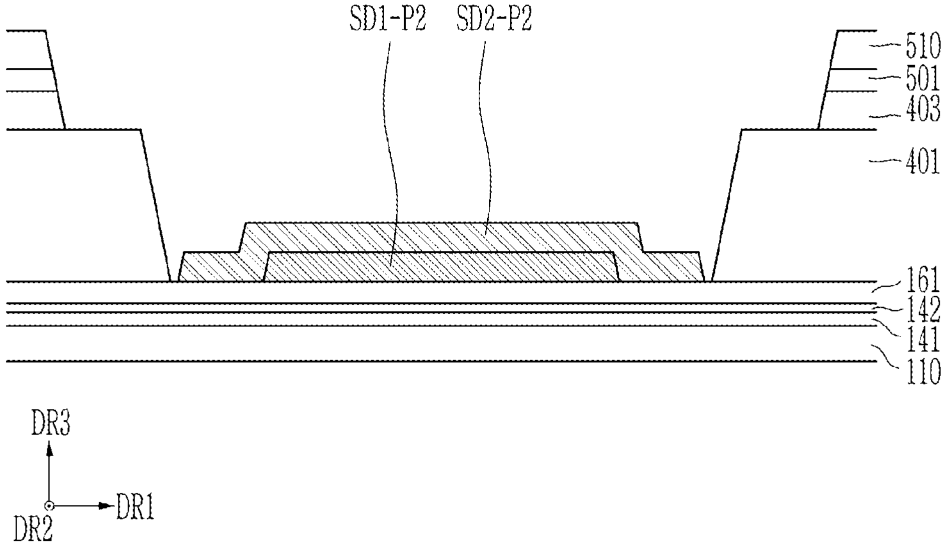

On the other hand, the embodiment of FIG. 23 is an embodiment in which the openings of the first insulating part and the second insulating part are formed wider than the embodiment of FIG. 19, and all the conductive parts thereof are exposed by the first insulating part and the second insulating part.

Even in the embodiment of FIG. 23, the stacked structure of the insulating part may be changed as shown in FIG. 20 to FIG. 22.

The changed embodiment of FIG. 20 to FIG. 23 is only a portion of the changeable embodiment, and numerous variations may be possible.

Hereinafter, a pad part for a touch sensing part (TSP Pad; hereinafter referred to as a third pad part) that may be further included in the display panel DP will be described with reference to FIG. 24 to FIG. 29.

The pad part for the touch sensing part (TSP Pad) may include a conductive part, and an insulating part having an opening exposing the conductive part. In addition, in the following embodiment, the insulating part may include the upper sensing insulating layer 511.

First, a position in which the pad part for the touch sensing part (TSP Pad) of the display panel is formed will be described with reference to FIG. 24.

Figure 24:
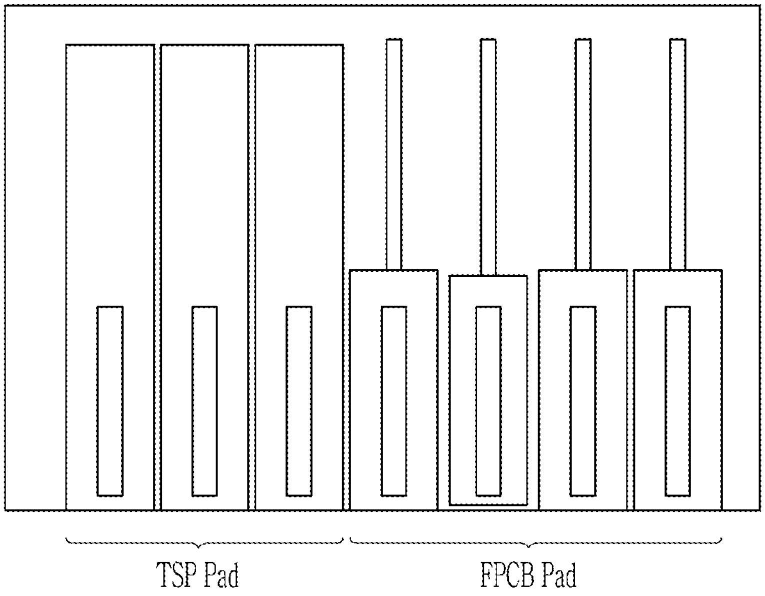
FIG. 24 illustrates a top plan view of a pad part in a non-display area of a display panel according to an embodiment.

FIG. 24 illustrates a top plan view of a pad part positioned in a non-display area PA of a display panel DP according to an embodiment.

FIG. 24 illustrates an enlarged view of a portion in which the pad part for the circuit board (FPCB Pad) is positioned among the non-display area PA of the display panel DP, and illustrates that the pad part for the touch sensing part (TSP Pad) is also positioned adjacent to the pad part for the circuit board (FPCB Pad).

However, in some embodiments, although the pad part for the touch sensing part (TSP Pad) may be positioned in the non-display area PA, such pad part may be formed apart from the pad part for the circuit board (FPCB Pad).

The above-described pad part for the touch sensing part (TSP pad) may have various cross-sectional structures, which will be described in detail with reference to FIG. 25 to FIG. 29.

FIG. 25 to FIG. 29 respectively illustrate a cross-sectional structure of a third pad part according to various embodiments.

Figure 25:
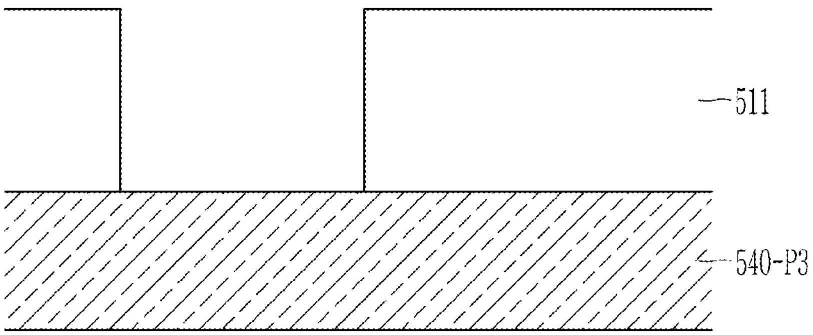
FIG. 25 to FIG. 29 respectively illustrate a cross-sectional structure of a third pad part according to various embodiments.

First, the pad part for the touch sensing part (TSP Pad) of FIG. 25 includes a first pad electrode 540-P3 formed on the same layer as the upper sensing electrode 540, and is configured as the upper sensing insulating layer 511 with an opening exposing the first pad electrode 540-P3. Here, the conductive part (e.g., a touch sensing conductive part) of the pad part for the touch sensing part (TSP Pad) is the first pad electrode 540-P3, and the insulating part (e.g., touch sensing insulating part) of the pad part for the touch sensing part (TSP Pad) is configured as the upper sensing insulating layer 511. The pad part for the touch sensing part (TSP Pad) may have a structure having no step, unlike other preceding pad parts (the pad part for the driver (IC Pad) and the pad part for the circuit board (FPCB Pad)). In some embodiments, the upper sensing electrode 540 may be formed as a plurality of conductive layers. Although not shown in FIG. 25, one of the second inorganic encapsulation layer 403, the lower sensing insulating layer 501, and the intermediate sensing insulating layer 510 may be positioned under the first pad electrode 540-P3.

That is, the conductive part of the pad part for the touch sensing part (TSP Pad) includes a first conductive part positioned on the same layer as the lower sensing electrode 541, and a second conductive part positioned on the same layer as the upper sensing electrode 540, where the first conductive part and the second conductive part may be connected to each other through an opening positioned in the intermediate sensing insulating layer 510.

Figure 27:
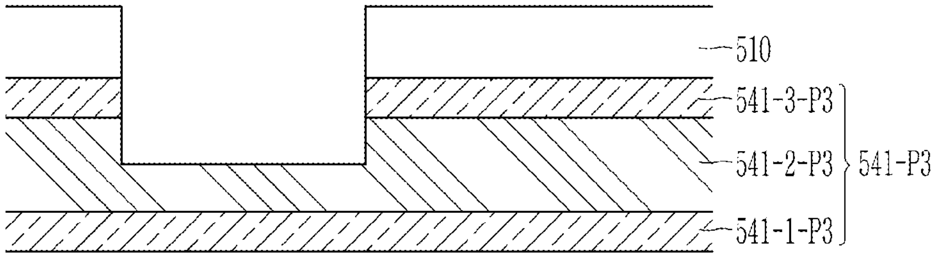
Figure 28:
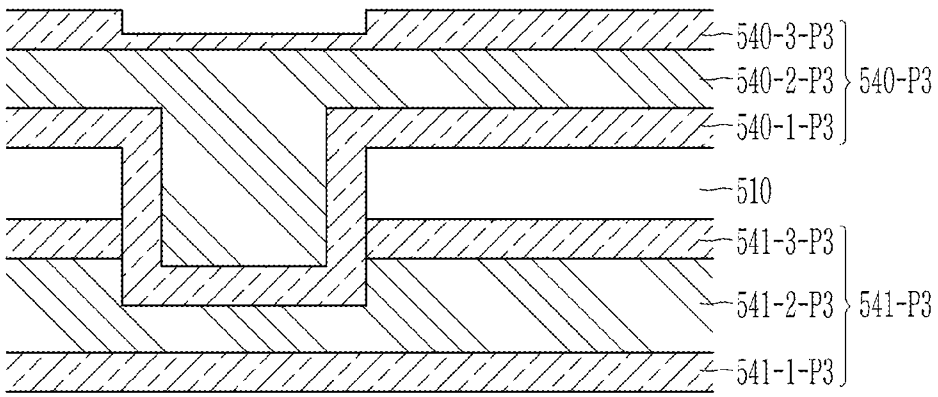

An embodiment formed of two electrodes (the first pad electrode 540-P3 as a second touch conductive part and first additional pad electrode 541-P3 as a first touch conductive part) as the conductive part of the pad part for the touch sensing part (TSP Pad) will be described with reference to FIG. 26 to FIG. 28. In addition, the embodiment of FIG. 26 to FIG. 28 is an embodiment in which each of the sensing electrodes 540 and 541 is configured as a triple layer.

Figure 26:
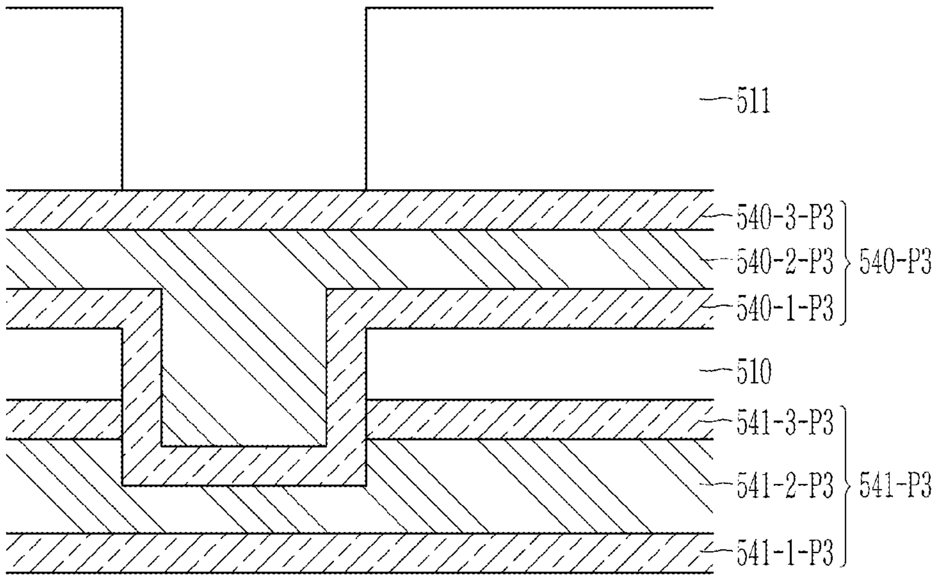

First, referring to FIG. 26, the intermediate sensing insulating layer 510 having an opening is positioned on the first additional pad electrode 541-P3 formed as a triple layer.

A summary of the manufacturing method of the pad part for the touch sensing part (TSP Pad) may be as follows.

The manufacturing method of the pad part for the touch sensing part (TSP Pad) includes forming a first conductive part together with the lower sensing electrode 541, forming the intermediate sensing insulating layer 510 having an opening (e.g., touch opening) exposing the first conductive part, and forming a second conductive part together with the upper sensing electrode 540, and the first conductive part and the second conductive part may be connected to each other through an opening positioned in the intermediate sensing insulating layer 510.

FIG. 27 is a drawing during the manufacturing process of FIG. 26, and shows a cross-sectional structure after forming an opening in the intermediate sensing insulating layer 510. Referring to FIG. 27, the first additional pad electrode 541-P3 is configured of a lower layer 541-1-P3, an intermediate layer 541-2-P3, and an upper layer 541-3-P3, and a side surface of the upper layer 541-3-P3 and the intermediate layer 541-2-P3 of the first additional pad electrode 541-P3 are exposed through the opening (e.g., a third opening) of the lower sensing insulating layer 510.

Then, referring back to FIG. 26, the first pad electrode 540-P3 formed as a triple layer is stacked on the lower sensing insulating layer 510 as the exposed first additional pad electrode 541-P3. Here, the first additional pad electrode 541-P3 is configured of a lower layer 540-1-P3, an intermediate layer 540-2-P3, and an upper layer 540-3-P3, and the lower layer 540-1-P3 of the first additional pad electrode 541-P3 is connected to a side surface of the upper layer 541-3-P3 of the exposed first additional pad electrode 541-P3 and the intermediate layer 541-2-P3 thereof.

Then, the upper sensing insulating layer 511 having an opening exposing the first pad electrode 540-P3 is formed.

Here, the lower layer of the triple layer may include titanium (Ti), the intermediate layer thereof may include aluminum (Al), and the upper layer thereof may include titanium (Ti).

In some embodiments, the upper sensing insulating layer 511 may be removed from the pad part for the touch sensing part (TSP Pad), and an embodiment in which the upper sensing insulating layer 511 is removed will be described with reference to FIG. 28 and FIG. 29.

Figure 29:
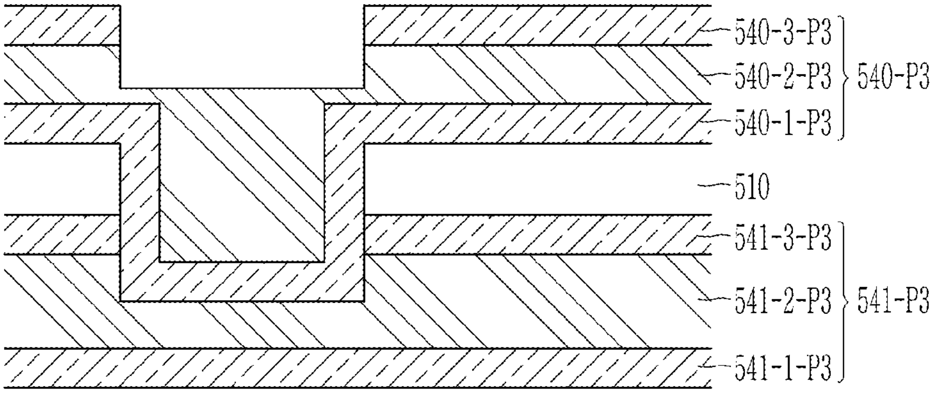

In the embodiment of FIG. 28 and the embodiment of FIG. 29, the first pad electrode 540-P3 has at least a partially etched structure, which may be etched when a recess is formed in the upper sensing insulating layer 511. The embodiment of FIG. 28 shows an embodiment in which the upper layer 540-3-P3 of the first pad electrode 540-P3 is partially etched to form the recess, by being etched less than the embodiment of FIG. 29. Meanwhile, the embodiment of FIG. 29 shows an embodiment in which the upper layer 540-3-P3 of the first pad electrode 540-P3 is etched, and then the intermediate layer 540-2-P3 thereof is also partially additionally etched, which together forms a single recess.

Although not shown in FIG. 26 to FIG. 28, the second inorganic encapsulation layer 403 may be positioned under the first additional pad electrode 541-P3.

Hereinafter, a structure of a pad part according to another manufacturing method will be described with reference to FIG. 30 and FIG. 31.

Figure 30:
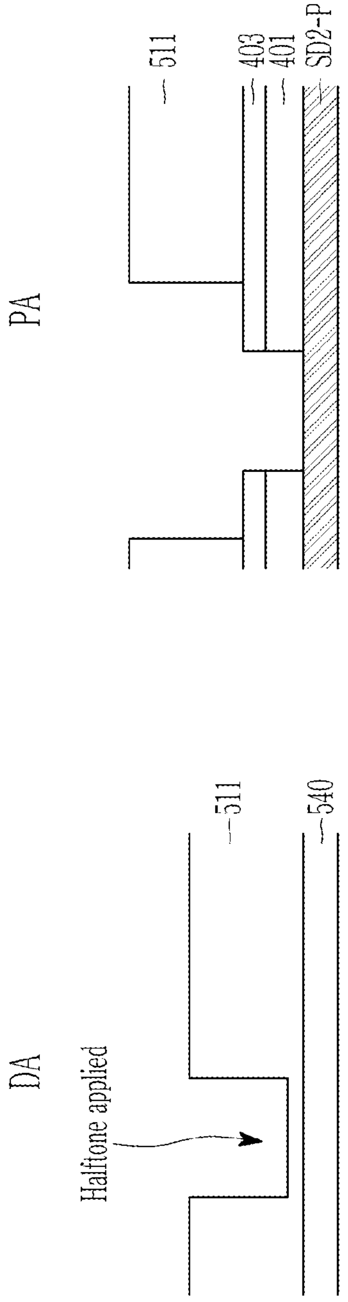
FIG. 30 illustrates a method of manufacturing (or providing) a pad part according to an embodiment.
Figure 31:
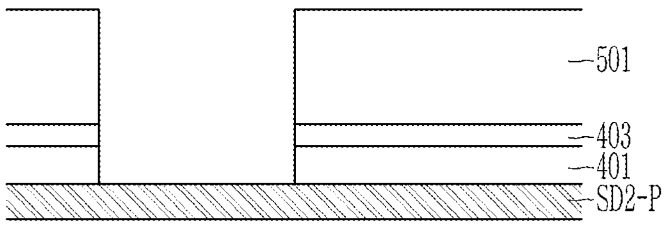
FIG. 31 illustrates a cross-sectional structure of a pad part according to an embodiment.

In FIG. 30 and FIG. 31, the pad part may be one of the pad part for the driver (IC Pad), the pad part for the circuit board (FPCB Pad), and the pad part for the touch sensing part (TSP Pad).

First, a manufacturing method of etching at different depths in one process by using a halftone mask will be described with reference to FIG. 30.

FIG. 30 illustrates a manufacturing method of a pad part according to an embodiment.

FIG. 30 shows the display area DA and the non-display area PA, and when the upper sensing insulating layer 511 is etched, a recess is formed to correspond to a halftone portion of a mask in the display area DA. Thus, when the pad part of the non-display area PA is deeply etched, the upper sensing electrode 540 positioned under the upper sensing insulating layer 511 may be prevented from being etched. In this case, when the pad part of the non-display area PA is etched, some area thereof may correspond to the halftone portion of the mask. As a result, when the conductive part is exposed in the pad part of the non-display area PA, an insulating part having a single-layered structure can be formed by single etching without double etching.

Hereinafter, a pad part having a structure having no step will be described with reference to FIG. 31.

FIG. 31 illustrates a cross-sectional structure of a pad part according to an embodiment.

In the embodiment of FIG. 31, the conductive part of the pad part of the non-display area PA is configured as a pad electrode SD2-P positioned on the second data conductive layer, and the insulating part thereon includes the first inorganic encapsulation layer 401, the second inorganic encapsulation layer 403, and a lower sensing insulating layer 501. In addition, an opening exposing the pad electrode SD2-P are formed in the first inorganic encapsulation layer 401, the second inorganic encapsulation layer 403, and the lower sensing insulating layer 501, and no step is formed in the insulating part and the pad electrode SD2-P is exposed through one opening.

Here, the lower sensing insulating layer 501 may be an inorganic insulating layer or an organic layer, and as the inorganic insulating layer it may include a silicon oxide (SiOx), a silicon nitride (SiNx), and a silicon oxynitride (SiON), and as the organic layer it may include at least one of a polyimide, a polyamide, an acryl resin, benzocyclobutene, and a phenol resin.

In some embodiments, an intermediate sensing insulating layer 510 or an upper sensing insulating layer 511 may be further included, and the intermediate sensing insulating layer 510 and the upper sensing insulating layer 511 may also be an inorganic insulating layer or an organic layer.

In the above, various embodiments in which when two inorganic layers of the encapsulation layer 400 stacked on the pad part, that is, the first inorganic encapsulation layer 401 and the second inorganic encapsulation layer 403 are removed, at least one of the sensing insulating layers 501, 510, and 511 positioned in the touch sensing part is etched together while exposing the conductive part positioned thereunder, have been described.

Figure 32:
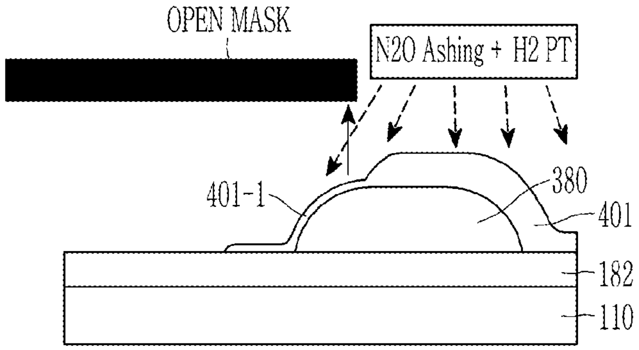
FIG. 32 illustrates a manufacturing method of a pad part according to a comparative example.

On the other hand, in a comparative example, as shown in FIG. 32, when the first inorganic encapsulation layer 401 and the second inorganic encapsulation layer 403 are removed, an open mask may be used.

FIG. 32 illustrates a manufacturing method of a pad part according to a comparative example.

In FIG. 32, the structure positioned between the substrate 110 and the second organic layer 182 is omitted, and an upper part of the second organic layer 182 is mainly shown.

The pixel defining layer 380 is positioned on the second organic layer 182, and when the first inorganic encapsulation layer 401 is stacked thereon and when a material for the first inorganic encapsulation layer 401 is stacked while covering the pad part of the non-display area PA with an open mask (OPEN MASK), a thinly stacked layer 401-1 (e.g., thickness portion) is formed even on a portion covered by the open mask (OPEN MASK). The thinly stacked layer 401-1 causes peeling or cracking that a layer that is subsequently stacked is peeled off.

However, when at least one of the sensing insulating layers 501, 510, and 511 is etched without using the open mask (OPEN MASK), even by removing portions the first inorganic encapsulation layer 401 and/or the second inorganic encapsulation layer 403, the peeling or cracking due to the thinly stacked layer (as a remaining portion of the first inorganic encapsulation layer 401 and/or the second inorganic encapsulation layer 403) does not occur.

While this disclosure has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A method of providing a display device, the method comprising:

providing a display area and a non-display area which is adjacent to the display area; and providing a pad part in the non-display area and exposed to outside the display device, wherein the providing of the pad part comprises:

providing a conductive layer at which the pad part is exposed to outside the display device, the conductive layer having an upper surface, and providing an insulating part on the upper surface of the conductive layer, wherein the providing of the insulating part of the pad part includes:

providing a first insulating layer and a second insulating layer in order from the upper surface of the conductive layer, providing an opening in the second insulating layer which exposes a part of an upper surface of the first insulating layer which is furthest from the conductive layer along a thickness direction, to outside the second insulating layer;

providing an additional insulating layer covering the second insulating layer, in the opening of the second insulating layer, and covering the first insulating layer which is exposed outside of the second insulating layer; and removing a portion of the additional insulating layer and a portion of the first insulating layer to provide an opening in the first insulating layer which is smaller than the opening in the second insulating layer and a remaining portion of the additional layer which is in the opening of the second insulating layer and in which an opening of the remaining portion is defined, wherein the upper surface of the conductive layer is exposed to outside the additional insulating layer through respective openings in the first insulating layer, the second insulating layer and the remaining portion of the additional insulating layer.

2. The method of claim 1, wherein:

the providing of the display area includes providing a pixel including a light emitting element, an encapsulation layer covering the light emitting element, and a touch sensing part on the encapsulation layer;

the encapsulation layer includes a first inorganic encapsulation layer, an organic encapsulation layer and a second inorganic encapsulation layer; and the first insulating layer and the first inorganic encapsulation layer are respective portions of a same material layer.

3. The method of claim 2, further comprising providing etching of the second inorganic encapsulation layer in the display area, wherein:

the providing of the opening in the second insulating layer in the non-display area is performed together with the etching of the second inorganic encapsulation layer.

4. The method of claim 2, wherein:

the providing of the touch sensing part in the display area includes providing in order from the encapsulation layer:

a lower sensing insulating layer;

a lower sensing electrode;

an intermediate sensing insulating layer;

an upper sensing electrode; and an upper sensing insulating layer, further comprising providing etching of the lower sensing insulating layer or the intermediate sensing insulating layer in the display area, together with the providing of the opening in the second insulating layer.

5. The method of claim 4, wherein:

the providing of the additional insulating layer is performed together with providing of the upper sensing insulating layer.

6. The method of claim 4, wherein:

the providing of the pad part comprises providing a pad part for the touch sensing part; and the providing of the pad part for the touch sensing part includes:

providing a first touch conductive part together with the providing of the lower sensing electrode;

providing an opening in the intermediate sensing insulating layer which exposes the first touch conductive part to outside the intermediate sensing insulating layer; and providing a second touch conductive part together with the providing of the upper sensing electrode, and the first touch conductive part and the second touch conductive part are connected to each other through the opening in the intermediate sensing insulating layer.

7. The method of claim 6, wherein:

at least one of the first touch conductive part and the second touch conductive part is a triple layer.

* * * * *